United States Patent
Kim et al.

(10) Patent No.: US 9,252,327 B1
(45) Date of Patent: Feb. 2, 2016

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Chul Min Kim, Gunpo-si (KR); Tan Sakong, Seoul (KR); Suk Ho Yoon, Seoul (KR); Keon Hun Lee, Seoul (KR); Do Young Rhee, Seoul (KR); Sang Don Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/698,575

(22) Filed: Apr. 28, 2015

(30) Foreign Application Priority Data

Sep. 18, 2014 (KR) .................. 10-2014-0124151

(51) Int. Cl.
  *H01L 29/207* (2006.01)
  *H01L 33/14* (2010.01)
  *H01L 33/32* (2010.01)
  *H01L 33/46* (2010.01)

(52) U.S. Cl.
  CPC .............. *H01L 33/145* (2013.01); *H01L 33/32* (2013.01); *H01L 33/46* (2013.01)

(58) Field of Classification Search
  None
  See application file for complete search history.

(56) References Cited

U.S. PATENT DOCUMENTS

| | | | |
|---|---|---|---|
| 6,372,608 B1 | 4/2002 | Shimoda et al. | |
| 6,645,830 B2 | 11/2003 | Shimoda et al. | |
| 6,677,619 B1 | 1/2004 | Nagahama et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,849,864 B2 | 2/2005 | Nagahama et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,058,105 B2 | 6/2006 | Lee et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,615,804 B2 | 11/2009 | Nagahama et al. | |
| 7,701,992 B2 | 4/2010 | Choi | |
| 7,709,857 B2 | 5/2010 | Kim et al. | |
| 7,724,795 B2 | 5/2010 | Son et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,804,869 B2 | 9/2010 | Freund | |
| 7,940,350 B2 | 5/2011 | Jeong | |

(Continued)

*Primary Examiner* — Jack Chen
(74) *Attorney, Agent, or Firm* — Sughrue Mion, PLLC

(57) ABSTRACT

A semiconductor light emitting device may include: a first conductivity type semiconductor layer; an active layer disposed on the first conductivity type semiconductor layer; an electron-blocking layer disposed on the active layer; a second conductivity type semiconductor layer disposed on the electron-blocking layer; and a hole-diffusion layer disposed between the electron-blocking layer and the second conductivity type semiconductor layer. The hole-diffusion layer may include three layers having different energy band gaps and different resistance levels and at least one of the three layers may contain Al. A composition of the Al may be lower in the at least one layer than in the electron-blocking layer.

20 Claims, 20 Drawing Sheets

(56) References Cited

U.S. PATENT DOCUMENTS

| | | |
|---|---|---|
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,541,794 B2 | 9/2013 | Nagahama et al. |
| 8,625,648 B2 | 1/2014 | Schillgalies et al. |
| 8,735,931 B2 | 5/2014 | Han et al. |
| 8,766,295 B2 | 7/2014 | Kim |
| 2008/0247435 A1 | 10/2008 | Choi |
| 2012/0076165 A1 | 3/2012 | Chakraborty et al. |
| 2013/0056785 A1* | 3/2013 | Hwang ............ H01L 27/15 257/99 |
| 2013/0099141 A1 | 4/2013 | Chua |
| 2013/0259079 A1 | 10/2013 | Bhattachaiya et al. |

* cited by examiner

SEMICONDUCTOR LIGHT EMITTING DEVICE

CROSS-REFERENCE TO RELATED APPLICATION

This application claims the priority to Korean Patent Application No. 10-2014-0124151 filed on Sep. 18, 2014, with the Korean Intellectual Property Office, the disclosure of which is incorporated herein by reference.

BACKGROUND

The present inventive concept relates to a semiconductor light emitting device.

A semiconductor light emitting device such as a light emitting diode (LED), a device containing a light emitting material therein to emit light, may convert energy generated due to recombination of electrons and electron holes into light to be emitted therefrom. Such a light emitting diode (LED), having many positive attributes, such as a relatively long lifespan, low power consumption, a rapid response rate, environmentally friendly characteristics, and the like, as compared with a light source according to the related art, is currently in widespread use as a lighting element, a display device and a light source, and the development thereof has been accelerated.

With the recent enlargement of the scope of application of LEDs, the use of LEDs has been extended to light sources in high current/high output application fields. As LEDs are required in high current/high output application fields as described above, research into improvements in light emitting efficiency has been continuously conducted in the technical field.

SUMMARY

An exemplary embodiment of the present inventive concept may provide a semiconductor light emitting device having improved light emitting efficiency and light output, by increasing injection efficiency of holes through the disposition of a hole-diffusion layer.

According to an exemplary embodiment of the present inventive concept, a semiconductor light emitting device may include: a first conductivity type semiconductor layer; an active layer disposed on the first conductivity type semiconductor layer; an electron-blocking layer disposed on the active layer; a second conductivity type semiconductor layer disposed on the electron-blocking layer; and a hole-diffusion layer disposed between the electron-blocking layer and the second conductivity type semiconductor layer. The hole-diffusion layer may include three layers having different energy band gaps and different resistance levels and at least one of the three layers contains Al. A composition of the Al may be lower in the at least one layer than in the electron-blocking layer.

The three layers of the hole-diffusion layer may include a first layer formed of $In_{x1}Ga_{1-x1}N(0<x1<1)$, a second layer formed of GaN, and a third layer formed of $Al_{x2}Ga_{1-x2}N$ $(0<x2<1)$ that are sequentially disposed on the electron-blocking layer.

The hole-diffusion layer may further include an additional layer of $In_{x3}Ga_{1-x3}N(0<x3<1)$ interposed between the second and third layers.

The composition of the Al may be reduced in a direction away from the electron-blocking layer.

The three layers of the hole-diffusion layer may include a first layer formed of GaN, a second layer formed of $In_{x1}Ga_{1-x1}N(0<x1<1)$, and a third layer formed of $Al_{x2}Ga_{1-x2}N$ $(0<x2<1)$, sequentially disposed on the electron-blocking layer.

The composition of the Al in the third layer may be reduced in a direction away from the electron-blocking layer.

The three layers of the hole-diffusion layer may include a first layer formed of GaN, a second layer formed of $Al_{x2}Ga_{1-x2}N(0<x2<1)$, and a third layer formed of $In_{x1}Ga_{1-x1}N$ $(0<x1<1)$, sequentially disposed on the electron-blocking layer.

The composition of the Al in the second layer may be reduced in a direction away from the electron-blocking layer.

At least one of the three layers may not contain an intentionally doped dopant.

Thicknesses of the respective layers forming the hole-diffusion layer may be within a range of 5 nm to 30 nm.

The active layer may have a structure in which quantum well layers formed of $In_{y1}Ga_{1-y1}N(0<y1<1)$ and quantum barrier layers formed of $Al_{x2}In_{y2}Ga_{1-x2-y2}N(0\le x2<1, 0\le y2<y1, 0\le x2+y2<1)$ are alternately stacked.

The electron-blocking layer may be formed of $Al_rGa_{1-r}N$ $(0<r\le1)$ and have the composition of the Al reduced in a direction away from the active layer.

The semiconductor light emitting device may further include a first conductive electrode formed on the first conductivity type semiconductor layer exposed by removing portions of the active layer and the second conductivity type semiconductor layer and a second conductive electrode formed on the second conductivity type semiconductor layer.

The semiconductor light emitting device may further include a conductive substrate formed on the second conductivity type semiconductor layer and a first conductive electrode formed on the first conductivity type semiconductor layer.

Among the three layers of the hole-diffusion layer, a layer having the largest energy band gap may have the largest thickness and a layer having the smallest energy band gap may have the smallest thickness.

According to another aspect of the present inventive concept, a semiconductor light emitting device may include: an n-type semiconductor layer and a p-type semiconductor layer; an active layer disposed between the n-type semiconductor layer and the p-type semiconductor layer; an electron-blocking layer disposed between the active layer and the p-type semiconductor layer; a diffusion barrier layer disposed between the active layer and the electron-blocking layer; and a hole-diffusion layer disposed between the electron-blocking layer and the p-type semiconductor layer. The hole-diffusion layer may include three layers having different compositions and different dopant-doping concentrations and at least one of the three layers may contain Al. A composition of the Al may be lower in the at least one layer than in the electron-blocking layer.

The diffusion barrier layer may contain a semiconductor material formed of $Al_cIn_dGa_{1-c-d}N(0\le c<1, 0\le d<1, 0\le c+d\le1)$, and the diffusion barrier layer may have an energy band gap greater than an energy band gap of the active layer and an energy band gap of the p-type semiconductor layer.

According to still another aspect of the present inventive concept, a semiconductor light emitting device may include a first conductivity type semiconductor layer; an active layer disposed on the first conductivity type semiconductor layer; an electron-blocking layer disposed on the active layer; a second conductivity type semiconductor layer disposed on the electron-blocking layer; and a hole-diffusion layer disposed between the electron-blocking layer and the second conductivity type semiconductor layer. The hole-diffusion layer may include three layers having different energy band gaps and at least one of the three layers contains Al. A composition of the Al in any layer of the hole-diffusion layer may be lower than in the electron-blocking layer.

Among the three layers of the hole-diffusion layer, a layer having the largest energy band gap may have the largest thickness and a layer having the smallest energy band gap may have the smallest thickness.

The semiconductor light emitting device may further include a diffusion barrier layer, containing a semiconductor material formed of $Al_cIn_dGa_{1-c-d}N(0 \leq c<1, 0 \leq d<1, 0 \leq c+d \leq 1)$, disposed between the active layer and the electron-blocking layer.

BRIEF DESCRIPTION OF DRAWINGS

The above and other aspects, features and other advantages of the present inventive concept will be more clearly understood from the following detailed description taken in conjunction with the accompanying drawings, in which.

DETAILED DESCRIPTION

Figure 1:
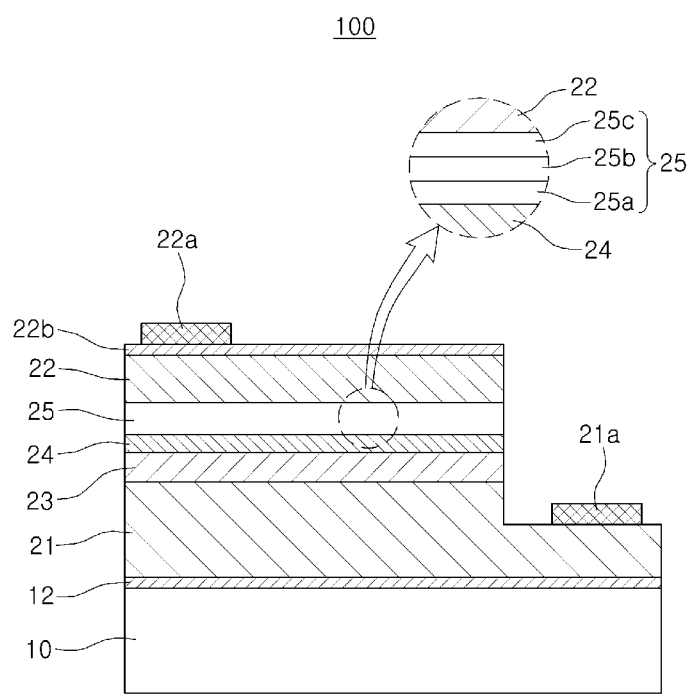
FIG. 1 is a cross-sectional view schematically illustrating a semiconductor light emitting device according to an exemplary embodiment of the present inventive concept.

Hereinafter, exemplary embodiments of the present inventive concept will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Figure 2:
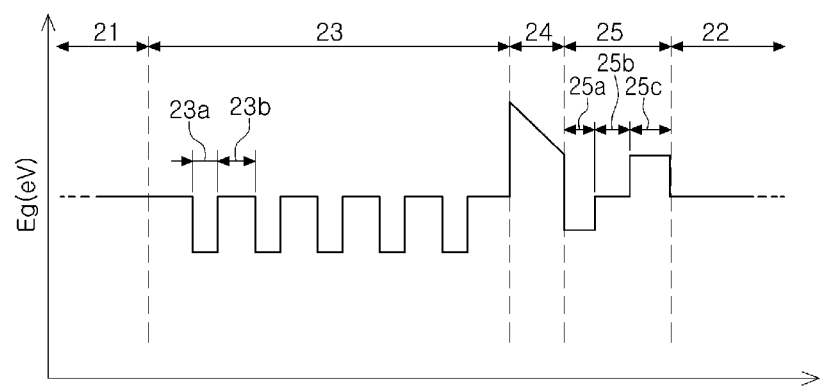
FIG. 2 is a diagram illustrating energy band gaps in a partial laminate structure of the semiconductor light emitting device according to an exemplary embodiment illustrated in FIG. 1.

FIG. 1 is a cross-sectional view schematically illustrating a semiconductor light emitting device 100 according to an exemplary embodiment of the present inventive concept. FIG. 2 is a diagram illustrating energy band gaps in a partial laminate structure of the semiconductor light emitting device 100 according to an exemplary embodiment illustrated in FIG. 1.

Referring to FIG. 1, the semiconductor light emitting device 100 according to the exemplary embodiment may include a substrate 10, a first conductivity type semiconductor layer 21 and a second conductivity type semiconductor layer 22 formed on the substrate 10, an active layer 23 disposed between the first and second conductivity type semiconductor layers 21 and 22, and an electron-blocking layer 24 disposed between the active layer 23 and the second conductivity type semiconductor layer 22. In addition, the semiconductor light emitting device 100 according to the exemplary embodiment may further include a hole-diffusion layer 25 between the electron-blocking layer 24 and the second conductivity type semiconductor layer 22. In addition, first and second electrodes 21a and 22a may be disposed on the first and second conductivity type semiconductor layers 21 and 22 to be electrically connected thereto, respectively.

Meanwhile, the first conductivity type semiconductor layer 21 may be an n-type semiconductor layer doped with an n-type dopant, and the second conductivity type semiconductor layer 22 may be a p-type semiconductor layer doped with a p-type dopant.

The substrate 10 may be provided as a semiconductor growth substrate and may be formed of an insulating or a conductive semiconductor material such as sapphire, silicon (Si), silicon carbide (SiC), $MgAl_2O_4$, MgO, $LiAlO_2$, $LiGaO_2$, or GaN. In this case, the substrate 10 may be preferably formed of sapphire having electrical insulation properties. Sapphire is a crystal having Hexa-Rhombo R3c symmetry, of which lattice constants in c-axis and a-axis directions are 13.001 Å and 4.758 Å, respectively. A sapphire crystal has a C-plane (0001), an A-plane (11-20), an R-plane (1-102), and the like. In this case, since a nitride semiconductor film can be relatively easily formed on the C-plane of the sapphire crystal and the C-plane is stable at high temperature, it is commonly used as a growth substrate for a nitride semiconductor film.

In addition, another material suitable for use in the substrate 10 may be, for example, a silicon (Si) substrate. The mass producibility may be improved by using the silicon (Si) substrate which is relatively inexpensive and suitable for being formed to have a large diameter. In the case of using the silicon (Si) substrate, after forming a buffer layer formed of a substance such as AlGaN on the substrate 10, a nitride semiconductor having a desired structure may grown on the buffer layer.

Meanwhile, the substrate 10 may be removed after a semiconductor laminate including the first and second conductivity type semiconductor layers 21 and 22 and the active layer 23 interposed therebetween has been grown. For example, the sapphire substrate may be removed using a laser lift-off (LLO) process of irradiating a laser beam onto an interface between the sapphire substrate and the semiconductor laminate, and a Si substrate and a SiC substrate may be removed by a method such as polishing, etching or the like.

In the exemplary embodiment, a buffer layer 12 may be interposed between the substrate 10 and the first conductivity type semiconductor layer 21. In general, when a semiconductor laminate is grown on the substrate 10, for example, when a GaN film serving as the first conductivity type semiconductor layer 21 is grown on a heterogeneous substrate, lattice defects such as dislocations may be caused due to a difference in lattice constants between the substrate 10 and the GaN film. In addition, the substrate 10 may be warped due to a difference in coefficients of thermal expansion, such that cracks may occur in the semiconductor laminate. In order to control the warpage and the defects, after forming the buffer layer 12 on the substrate 10, a semiconductor laminate having a desired structure, for example, the first conductivity type semiconductor layer 21 formed of a nitride semiconductor may grown on the buffer layer 12.

The buffer layer 12 may be formed of a material, for example, $Al_mIn_nGa_{1-m-n}N(0 \le m \le 1, 0 \le n \le 1)$, in particular, GaN, AlN, or AlGaN. For example, the buffer layer 12 may be an undoped GaN layer undoped with a dopant and be formed to have a predetermined thickness.

It goes without saying that the buffer layer 12 is not limited thereto. Thus, any material may be used, as long as it has a structure allowing for improvements in crystallinity of the semiconductor laminate. A material such as $ZrB_2$, $HfB_2$, ZrN, HfN, TiN, ZnO or the like may also be used. In addition, a combination of a plurality of layers or a layer formed by gradually changing a composition may also be used for the material of the buffer layer 12.

The first and second conductivity type semiconductor layers 21 and 22 may be formed of a nitride semiconductor, for example, a material having a composition of $Al_pIn_qGa_{1-p-q}N$ ($0 \le p<1$, $0 \le q<1$, $0 \le p+q<1$). In the exemplary embodiment, the first and second conductivity type semiconductor layers 21 and 22 may be formed of GaN doped with an n-type dopant and GaN doped with a p-type dopant, respectively.

The active layer 23 may emit light having a predetermined wavelength due to recombination of electrons and holes. The active layer 23 may be disposed between the first and second conductivity type semiconductor layers 21 and 22 and have a multiple quantum well (MQW) structure in which quantum well and quantum barrier layers are alternately stacked. For example, in the case of a nitride semiconductor, the active layer 23 may have a structure in which quantum well layers formed of $In_{y1}Ga_{1-y1}N(0<y1<1)$ and quantum barrier layers formed of $Al_{x2}In_{y2}Ga_{1-x2-y2}N(0 \le x2<1, 0 \le y2 \le y1, 0 \le x2+y2<1)$ are alternately stacked.

Depending on exemplary embodiments, the active layer 23 may have a single-quantum well (SQW) structure including a single quantum well layer.

Meanwhile, electrons having been moved from the first conductivity type semiconductor layer 21 to the active layer 23 may pass through the active layer 23 and overflow to the second conductivity type semiconductor layer 22. The electrons overflowing to the second conductivity type semiconductor layer 22 may be recombined with holes in a region except for the active layer 23, that is, in a non-light emitting region. The recombination may correspond to a nonradiative recombination, thereby degrading light emission efficiency of a semiconductor light emitting device. In order to reduce the nonradiative recombination, the electron-blocking layer 24 may be provided between the active layer 23 and the second conductivity type semiconductor layer 22.

Referring to FIG. 2 together with FIG. 1, the electron-blocking layer 24 may have an energy band gap greater than an energy band gap of the last quantum barrier layer of the active layer 23 in order to block the electrons overflowing from the active layer 23 to the p-type semiconductor layer (for example: the second conductivity type semiconductor layer 22). For example, the electron-blocking layer 24 may be formed of $Al_rGa_{1-r}N(0<r \le 1)$. In the exemplary embodiment, r in the Al composition of the electron-blocking layer 24 may be reduced in a direction away from the active layer 23. Thus, an energy band gap (Eg) of the electron-blocking layer 24 may be reduced in a direction away from the active layer 23. FIG. 2 illustrates a case in which an energy band gap (Eg) in an upper portion of the electron-blocking layer 24 adjacent to the hole-diffusion layer 25 is greater than an energy band gap (Eg) of the second conductivity type semiconductor layer 22, but is not limited thereto.

Depending on exemplary embodiments, the energy band gap (Eg) in the upper portion of the electron-blocking layer 24 may be identical to the energy band gap (Eg) of the second conductivity type semiconductor layer 22.

Depending on exemplary embodiments, the electron-blocking layer 24 may be formed of $Al_rGa_{1-r}N(0<r \le 1)$ in which r in the Al composition is not varied in a direction away from the active layer 23. That is, the electron-blocking layer 24 may be an AlGaN layer having a uniform Al composition.

Meanwhile, since the electron-blocking layer 24 may block the electrons overflowing from the active layer 23 to the second conductivity type semiconductor layer 22 but may also hinder the movement of holes moving from the second conductivity type semiconductor layer 22 to the active layer 23, the electron-blocking layer 24 may be doped with a p-type dopant. The p-type dopant may be, for example, Mg, but is not limited thereto.

When a p-type GaN material is formed using a metal-organic chemical vapor deposition (MOCVD) process in the technical field, Mg atoms used as a doping material are not completely substituted with the site of Ga and may be combined with pyrolyzed hydrogen from $NH_3$ injected as a nitrogen source to form an Mg—H complex, thereby causing difficulties in the activation of Mg. Thus, even in the case that an Mg concentration of a p-type GaN layer actually doped with Mg is approximately $10^{19}$ to $10^{21}/cm^3$, the concentration of holes, carriers after heat treatments for dopant activation, may be approximately $5 \times 10^{17}/cm^3$, considerably low as compared to the concentration of electrons, carriers of an n-type GaN layer doped with Si, on a level of $1 \times 10^{19}/cm^3$. Due to the excessively doped Mg atoms or Mg—H complex, a non-uniform hole current may be caused within the p-type semiconductor layer and accordingly, the efficiency of injecting holes into the active layer may be degraded. Therefore, light emission efficiency of the semiconductor light emitting device may be decreased.

In order to improve the light emission efficiency of the semiconductor light emitting device, it may be necessary to improve the non-uniform hole current in the interior of the p-type semiconductor layer and to increase the efficiency of injecting holes into the active layer. To this end, the semiconductor light emitting device according to an exemplary embodiment of the present inventive concept may further include the hole-diffusion layer 25 able to disperse the non-uniform hole current.

Referring to FIG. 2 together with FIG. 1, the hole-diffusion layer 25 disposed between the electron-blocking layer 24 and the second conductivity type semiconductor layer 22 may have three layers 25a, 25b and 25c having different energy band gaps Eg and different specific resistance levels. The three layers 25a, 25b and 25c of the hole-diffusion layer 25 may be formed of different nitride semiconductor compounds. In the exemplary embodiment, the hole-diffusion layer 25 may include a first layer 25a formed of $In_{x1}Ga_{1-x1}N$ (0<x1<1), a second layer 25b formed of GaN and a third layer 25c formed of $Al_{x2}Ga_{1-x2}N$(0<x2<1), sequentially disposed on the electron-blocking layer 24. Thus, an energy band gap Eg of the first layer 25a may be the smallest and an energy band gap Eg of the third layer 25c may be the largest.

Meanwhile, in the exemplary embodiment, x1 in the In composition of the first layer 25a may be less than y1 in the In composition of a quantum well layer 23a of the active layer 23. However, the present inventive concept is not limited thereto and depending on exemplary embodiments, x1 in the In composition of the first layer 25a may be greater than y1 in the In composition of the quantum well layer 23a of the active layer 23. In the exemplary embodiment, x2 in the Al composition of the third layer 25c may be less than r in the Al composition of the electron-blocking layer 24.

Since the first layer 25a, the second layer 25b, and the third layer 25c are formed of different compositional compounds as described above, even in the case that they are undoped with a dopant or are doped with a dopant at the same concentration, they may have different specific resistance levels. Meanwhile, the first layer 25a, the second layer 25b, and the third layer 25c are doped with a p-type dopant at different concentrations, whereby they may have different specific resistance levels. At least one layer from among the first layer 25a, the second layer 25b, and the third layer 25c may not contain an intentionally doped dopant. For example, in the exemplary embodiment, the third layer 25c may be a GaN semiconductor layer containing Al without an intentionally doped dopant.

Thicknesses of the first layer 25a, the second layer 25b, and the third layer 25c forming the hole-diffusion layer 25 may be appropriately determined within a range of 5 nm to 30 nm in consideration of electrical resistance levels or crystalline defects caused by lattice mismatches in the respective layers. In the exemplary embodiment, the thickness of the first layer 25a having the smallest energy band gap Eg is the smallest, while the thickness of the third layer 25c having the largest energy band gap Eg is the greatest.

Meanwhile, the first conductivity type semiconductor layer 21, the second conductivity type semiconductor layer 22, the active layer 23, the electron-blocking layer 24, and the hole-diffusion layer 25 may be grown using a process well known in the technical field, such as metal organic chemical vapor deposition (MOCVD), molecular beam epitaxy (MBE), hydride vapor phase epitaxy (HVPE), or the like.

Figure 3:
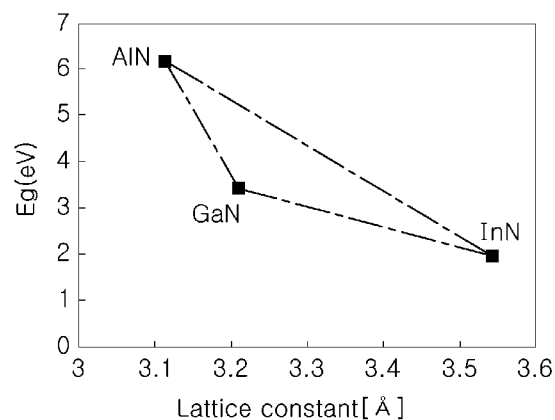
FIG. 3 is a graph illustrating energy band gaps and lattice constants of a nitride semiconductor.

FIG. 3 is a graph illustrating energy band gaps and lattice constants of respective compounds. FIG. 3 is a graph showing relationships between energy band gaps Eg and respective compositions of a nitride semiconductor (a compositional ratio of Al, In and Ga).

Referring to FIG. 3, AlN has the smallest lattice constant and the largest energy band gap Eg, while InN has the largest lattice constant and the smallest energy band gap Eg. A composition of Al, Ga or In may be appropriately adjusted within a triangular region formed by GaN, AlN and InN, whereby a semiconductor layer having an energy band gap being within a range from approximately 2 eV to approximately 6 eV may be formed.

Figure 4:
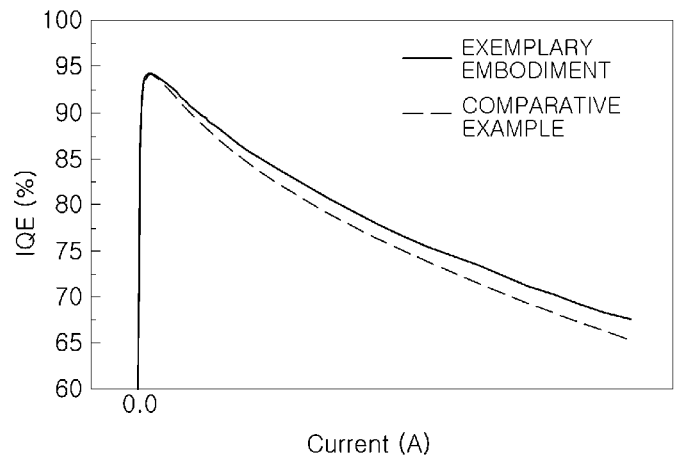
FIG. 4 is a graph illustrating characteristics of the semiconductor light emitting device according to an exemplary embodiment of the present inventive concept through comparative experimentation.

FIG. 4 is a graph illustrating characteristics of the semiconductor light emitting device according to an exemplary embodiment of the present inventive concept through comparative experimentation. Specifically, FIG. 4 is a graph in which internal quantum efficiency (IQE) of the semiconductor light emitting device 100 according to the exemplary embodiment described with reference to FIGS. 1 and 2 is compared with that of a comparative example.

The comparative example is a semiconductor light emitting device that does not include the hole-diffusion layer 25, unlike the semiconductor light emitting device 100 according to the exemplary embodiment. That is, a graph indicated as the comparative example in FIG. 4 refers to internal quantum efficiency (IQE) of a semiconductor light emitting device in which the second conductivity type semiconductor layer 22 is disposed directly on the electron-blocking layer 24.

Referring to FIG. 4, it could be confirmed that a phenomenon of a reduction of internal quantum efficiency (IQE) according to an increase in current was smaller in the exemplary embodiment than in the comparative example. That is, it could be confirmed that in the case of the inventive example, a droop phenomenon of internal quantum efficiency (IQE) was improved toward a high current region, as compared to the case of the comparative example. In other words, according to the exemplary embodiment, a semiconductor light emitting device having improved light emission efficiency in a high current region may be obtained. Such a result may be obtained by forming the hole-diffusion layer 25 including at least three or more layers having different specific resistance levels to effectively disperse holes in a transverse direction, thereby allowing for improvements in injection efficiency of the holes injected into the active layer 23. In addition, it is due to the fact that the hole-diffusion layer 25 having a structure in which multiple layers having different energy band gaps are present may be disposed to be adjacent to the electron-blocking layer 24, whereby a hole barrier in a valence band may be mitigated and accordingly, the efficiency of injecting holes into the active layer 23 may be improved.

Moreover, although not illustrated, light output characteristics of the semiconductor light emitting device 100 according to the exemplary embodiment were also improved as compared the case of the comparative example by 3%.

Hereinafter, remaining configurations of the semiconductor light emitting device 100 according the exemplary embodiment will be described with reference to FIG. 1, again.

The semiconductor light emitting device 100 may include the first electrode 21a electrically connected to the first conductivity type semiconductor layer 21 and the second electrode 22a electrically connected to the second conductivity type semiconductor layer 22. The first and second electrodes 21a and 22a may be provided as elements for applying driving power to the semiconductor light emitting device 100. The first and second electrodes 21a and 22a may be a material selected from Ag, Al, Ni, Cr, Pd, Cu, Pt, Sn, W, Au, Rh, Ir, Ru, Mg, Zn and the like. The first and second electrodes 21a and 22a may be formed by a process such as a deposition process, a sputtering process, a plating process or the like. In addition, the first and second electrodes 21a and 22a may respectively have a structure of two or more layers formed of materials such as Ni/Ag, Zn/Ag, Ni/Al, Zn/Al, Pd/Ag, Pd/Al, Ir/Ag, Ir/Au, Pt/Ag, Pt/Al or Ni/Ag/Pt. Since the material of the first and second electrodes 21a and 22a is not limited to the materials described above, a material capable of being in ohmic contact or electrical contact with the first and second conductivity type semiconductor layers 21 and 22 among conductive or reflective materials may be employed.

An ohmic electrode layer 22b may be formed between the second conductivity type semiconductor layer 22 and the second electrode 22a. The ohmic electrode layer 22b may be formed of a material exhibiting electrical ohmic characteristics with respect to the second conductivity type semiconductor layer 22. Meanwhile, in the case of a light emitting device having a structure in which light having been generated from the active layer 23 passes through the second conductivity type semiconductor layer 22 to be emitted outwardly, the ohmic electrode layer 22b may be formed of a transparent conductive material having a high degree of light transmittance as well as relatively excellent ohmic characteristics, such as ITO, CIO, ZnO, graphene or the like, among transparent electrode materials, but is not limited thereto.

In addition, in the case of a light emitting device having a structure in which light having been generated from the active layer 23 passes through the first conductivity type semiconductor layer 21 to be emitted outwardly, for example, a flip-chip type light emitting device in which the first and second electrodes 21a and 22a are mounted toward a lead frame of a package, the ohmic electrode layer 22b may be formed of a light reflective material, for example, a highly reflective metal. However, the ohmic electrode layer 22b is not necessarily required in the exemplary embodiment and in some cases, it may be excluded.

In the case of the structure illustrated in FIG. 1, the first and second electrodes 21a and 22a are disposed on upper surfaces of the first conductivity type semiconductor layer 21 and the ohmic electrode layer 22b, respectively, but such an electrode formation scheme is only provided byway of example. Electrodes may be formed at various positions of the semiconductor laminate including the first and second conductivity type semiconductor layers 21 and 22 and the active layer 23.

FIGS. 5A through 5G are diagrams each illustrating energy band gaps in a partial laminate structure of a semiconductor light emitting device according to a modified example modified from FIG. 1.

Figure 5A:
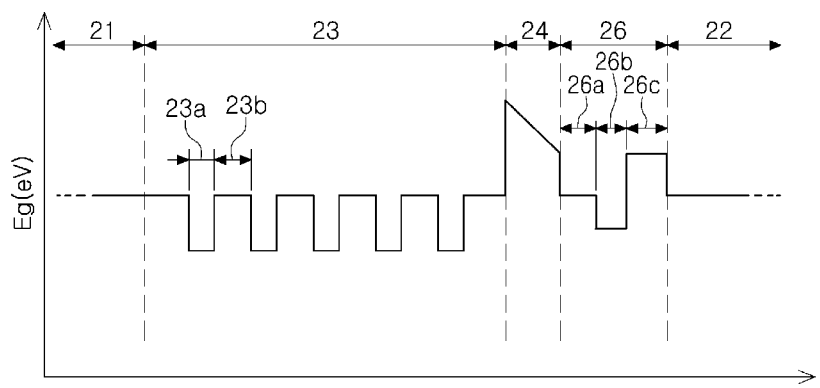
FIGS. 5A through 5G are diagrams each illustrating energy band gaps in a partial laminate structure of a semiconductor light emitting device according to exemplary embodiments modified from FIG. 1.

Referring to FIG. 5A, a hole-diffusion layer 26 disposed between the electron-blocking layer 24 and the second conductivity type semiconductor layer 22 may have three layers 26a, 26b and 26c having different energy band gaps Eg and different specific resistance levels. The three layers 26a, 26b and 26c of the hole-diffusion layer 26 may be formed of different nitride semiconductor compounds. The hole-diffusion layer 26 may include a first layer 26a formed of GaN, a second layer 26b formed of $In_{x1}Ga_{1-x1}N(0<x1<1)$, and a third layer 26c formed of $Al_{x2}Ga_{1-x2}N(0<x2<1)$, sequentially disposed on the electron-blocking layer 24. Thus, an energy band gap Eg of the second layer 26b may be the smallest and an energy band gap Eg of the third layer 26c may be the largest.

Meanwhile, in the exemplary embodiment, x1 in the In composition of the second layer 26b may be less than y1 in the In composition of the quantum well layer 23a of the active layer 23. However, the present inventive concept is not limited thereto and depending on exemplary embodiments, x1 in the In composition of the second layer 26b may be greater than y1 in the In composition of the quantum well layer 23a of the active layer 23. In the exemplary embodiment, x2 in the Al composition of the third layer 26c may be less than r in the Al composition of the electron-blocking layer 24.

Since the first layer 26a, the second layer 26b, and the third layer 26c are formed of different compositional compounds as described above, they may have different specific resistance levels even in the case that they are undoped with a dopant or are doped with a dopant at the same concentration. Meanwhile, the first layer 26a, the second layer 26b, and the third layer 26c are doped with a p-type dopant at different concentrations, whereby they may have different specific resistance levels. At least one layer from among the first layer 26a, the second layer 26b, and the third layer 26c may not contain an intentionally doped dopant. For example, in the exemplary embodiment, the third layer 26c may be a GaN semiconductor layer containing Al without an intentionally doped dopant.

Thicknesses of the first layer 26a, the second layer 26b, and the third layer 26c forming the hole-diffusion layer 26 may be appropriately determined within a range of 5 nm to 30 nm in consideration of electrical resistance levels or crystalline defects caused by lattice mismatches in the respective layers. In the exemplary embodiment, the thickness of the second layer 26b having the smallest energy band gap Eg is the smallest, while the thickness of the third layer 26c having the largest energy band gap Eg is the greatest.

Figure 5B:
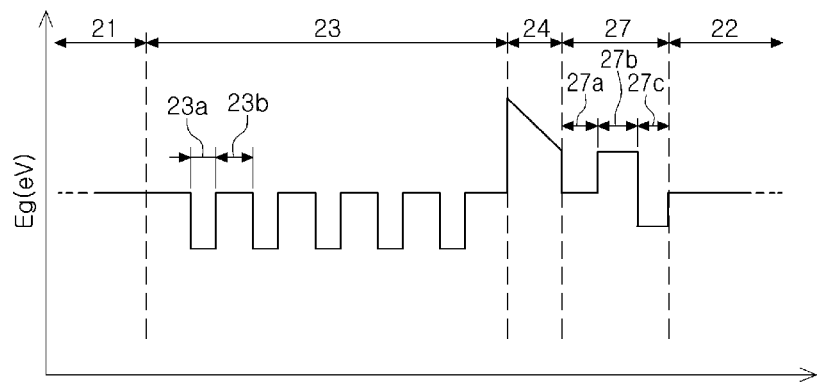

Referring to FIG. 5B, a hole-diffusion layer 27 disposed between the electron-blocking layer 24 and the second conductivity type semiconductor layer 22 may have three layers 27a, 27b and 27c having different energy band gaps Eg and different specific resistance levels. The three layers 27a, 27b and 27c of the hole-diffusion layer 27 may be formed of different nitride semiconductor compounds. In the exemplary embodiment, the hole-diffusion layer 27 may include a first layer 27a formed of GaN, a second layer 27b formed of $Al_{x2}Ga_{1-x2}N(0<x2<1)$, and a third layer 27c formed of $In_{x1}Ga_{1-x1}N(0<x1<1)$, sequentially disposed on the electron-blocking layer 24. Thus, an energy band gap Eg of the third layer 27c may be the smallest and an energy band gap Eg of the second layer 27b may be the largest.

Meanwhile, in the exemplary embodiment, x1 in the In composition of the third layer 27c may be less than y1 in the In composition of the quantum well layer 23a of the active layer 23. However, the present inventive concept is not limited thereto and depending on exemplary embodiments, x1 in the In composition of the third layer 27c may be greater than y1 in the In composition of the quantum well layer 23a of the active layer 23. In the exemplary embodiment, x2 in the Al composition of the second layer 27b may be less than r in the Al composition of the electron-blocking layer 24.

Since the first layer 27a, the second layer 27b, and the third layer 27c are formed of different compositional compounds as described above, they may have different specific resistance levels even in the case that they are undoped with a dopant or are doped with a dopant at the same concentration. Meanwhile, the first layer 27a, the second layer 27b, and the third layer 27c are doped with a p-type dopant at different concentrations, whereby they may have different specific resistance levels. At least one layer from among the first layer 27a, the second layer 27b, and the third layer 27c may not contain an intentionally doped dopant. For example, in the exemplary embodiment, the second layer 27b may be a GaN semiconductor layer containing Al without an intentionally doped dopant.

Thicknesses of the first layer 27a, the second layer 27b, and the third layer 27c forming the hole-diffusion layer 27 may be appropriately determined within a range of 5 nm to 30 nm in consideration of electrical resistance levels or crystalline defects caused by lattice mismatches in the respective layers. In the exemplary embodiment, the thickness of the third layer 27c having the smallest energy band gap Eg is the smallest, while the thickness of the second layer 27b having the largest energy band gap Eg is the greatest.

Figure 5C:
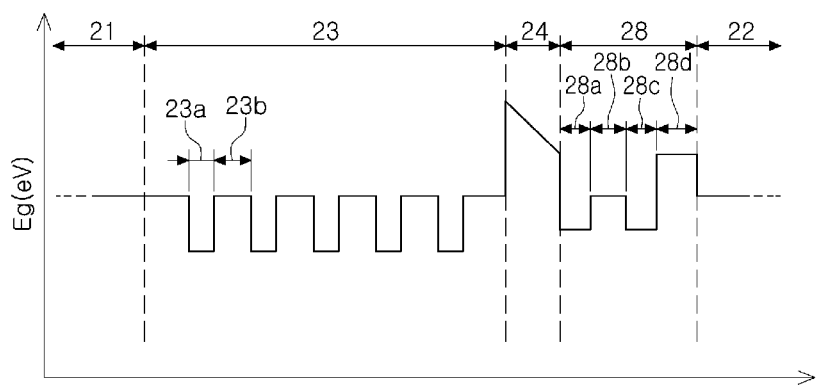

Referring to FIG. 5C, a hole-diffusion layer 28 disposed between the electron-blocking layer 24 and the second conductivity type semiconductor layer 22 may have four layers 28a, 28b, 28c, and 28d having different energy band gaps Eg and different specific resistance levels. The four layers 28a, 28b, 28c, and 28d of the hole-diffusion layer 28 may be formed of different nitride semiconductor compounds. In the exemplary embodiment, the hole-diffusion layer 28 may include a first layer 28a formed of $In_{x1}Ga_{1-x1}N(0<x1<1)$, a second layer 28b formed of GaN, a third layer 28c formed of $In_{x3}Ga_{1-x3}N(0<x3<1)$, and a fourth layer 28d formed of $Al_{x2}Ga_{1-x2}N(0<x2<1)$. In the exemplary embodiment, as illustrated in FIG. 5C, x1 in the In composition of the first layer may be identical to x3 in the In composition of the third layer. Thus, energy band gaps Eg of the first and third layers 28a and 28c may be the smallest and an energy band gap Eg of the fourth layer 28d may be the largest. However, the present inventive concept is not limited thereto, and, depending on exemplary embodiments, x1 in the In composition of the first layer may be greater or less than x3 in the In composition of the third layer.

Meanwhile, in the exemplary embodiment, x1 in the In composition of the first layer 28a and x3 in the In composition of the third layer 28c may be less than y1 in the In composition of the quantum well layer 23a of the active layer 23. However, the present inventive concept is not limited thereto and depending on exemplary embodiments, x1 in the In composition of the first layer 28a and x3 in the In composition of the third layer 28c may be greater than y1 in the In composition of the quantum well layer 23a of the active layer 23. In the exemplary embodiment, x2 in the Al composition of the fourth layer 28d may be less than r in the Al composition of the electron-blocking layer 24.

Since the first to fourth layers 28a, 28b, 28c, and 28d are formed of different compositional compounds as described above, they may have different specific resistance levels even in the case that they are undoped with a dopant or are doped with a dopant at the same concentration. Meanwhile, the first to fourth layers 28a, 28b, 28c, and 28d are doped with a p-type dopant at different concentrations, whereby they may have different specific resistance levels. At least one layer from among the first to fourth layers 28a, 28b, 28c, and 28d may not contain an intentionally doped dopant. For example, in the exemplary embodiment, the fourth layer 28d may be a GaN semiconductor layer containing Al without an intentionally doped dopant.

Figure 5D:
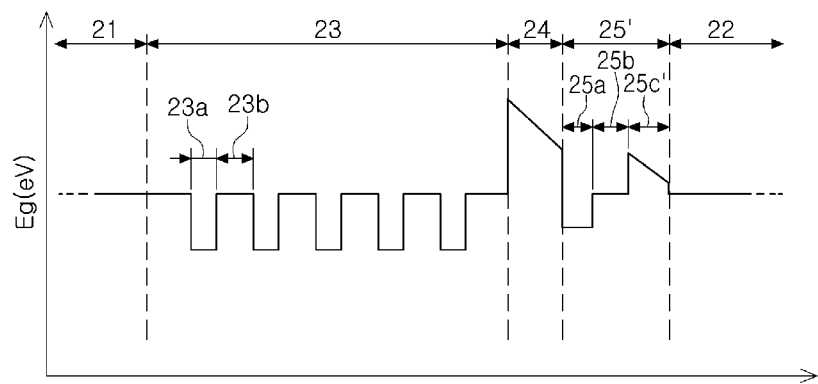

Referring to FIG. 5D, a hole-diffusion layer 25' disposed between the electron-blocking layer 24 and the second conductivity type semiconductor layer 22 may have three layers 25a, 25b and 25c' having different energy band gaps Eg and different specific resistance levels.

The three layers 25a, 25b and 25c' of the hole-diffusion layer 25' may be formed of different nitride semiconductor compounds. In the exemplary embodiment, the hole-diffusion layer 25' may include a first layer 25a formed of $In_{x1}Ga_{1-x1}N(0<x1<1)$, a second layer 25b formed of GaN, and a third layer 25c' formed of $Al_{x2}Ga_{1-x2}N(0<x2<1)$, sequentially disposed on the electron-blocking layer 24. Thus, an energy band gap Eg of the first layer 25a may be the smallest and an energy band gap Eg of the third layer 25c' may be the largest.

Although the exemplary embodiment is mostly the same as the foregoing embodiment described with reference to FIG. 2, x2 in the Al composition of the third layer 25c' may be reduced in a direction away from the active layer 23. In the exemplary embodiment, x2 in the Al composition of the third layer 25c' may be less than r in the Al composition of the electron-blocking layer 24.

Figure 5E:
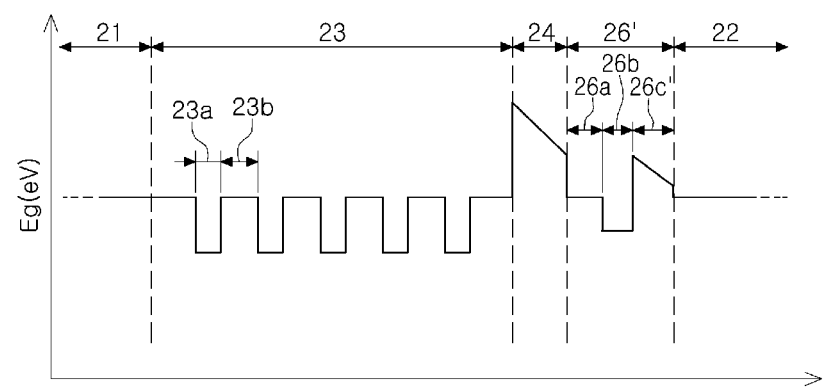

Referring to FIG. 5E, a hole-diffusion layer 26' disposed between the electron-blocking layer 24 and the second conductivity type semiconductor layer 22 may have three layers 26a, 26b and 26c' having different energy band gaps Eg and different specific resistance levels.

The three layers 26a, 26b and 26c' of the hole-diffusion layer 26' may be formed of different nitride semiconductor compounds. The hole-diffusion layer 26' may include a first layer 26a formed of GaN, a second layer 26b formed of $In_{x1}Ga_{1-x1}N(0<x1<1)$, and a third layer 26c' formed of $Al_{x2}Ga_{1-x2}N(0<x2<1)$, sequentially disposed on the electron-blocking layer 24. Thus, an energy band gap Eg of the second layer 26b may be the smallest and an energy band gap Eg of the third layer 26c' may be the largest.

Although the exemplary embodiment is mostly the same as the foregoing embodiment described with reference to FIG. 5A, x2 in the Al composition of the third layer 26c' may be reduced in a direction away from the active layer 23. In the exemplary embodiment, x2 in the Al composition of the third layer 26c' may be less than r in the Al composition of the electron-blocking layer 24.

Figure 5F:
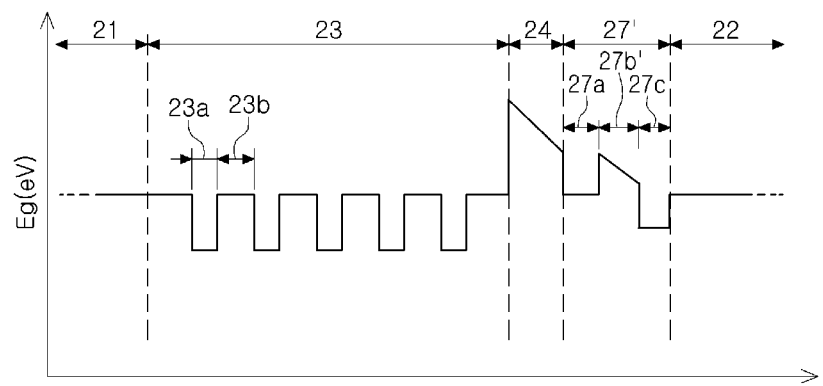

Referring to FIG. 5F, a hole-diffusion layer 27' disposed between the electron-blocking layer 24 and the second conductivity type semiconductor layer 22 may have three layers 27a, 27b' and 27c having different energy band gaps Eg and different specific resistance levels. The three layers 27a, 27b' and 27c of the hole-diffusion layer 27' may be formed of different nitride semiconductor compounds. The hole-diffusion layer 27' may include a first layer 27a formed of GaN, a second layer 27b' formed of $Al_{x2}Ga_{1-x2}N(0<x2<1)$, and a third layer 27c formed of $In_{x1}Ga_{1-x1}N(0<x1<1)$, sequentially disposed on the electron-blocking layer 24. Thus, an energy band gap Eg of the third layer 27c may be the smallest and an energy band gap Eg of the second layer 27b' may be the largest.

Although the exemplary embodiment is mostly the same as the foregoing embodiment described with reference to FIG. 5B, x2 in the Al composition of the second layer 27b' may be reduced in a direction away from the active layer 23. In the exemplary embodiment, x2 in the Al composition of the second layer 27b' may be less than r in the Al composition of the electron-blocking layer 24.

Figure 5G:
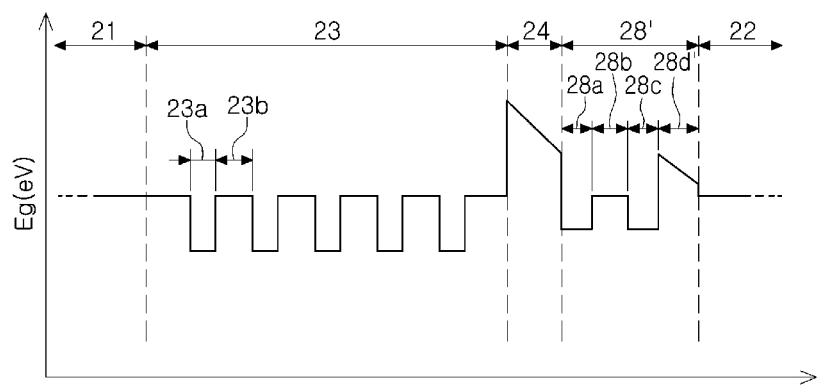

Referring to FIG. 5G, a hole-diffusion layer 28' disposed between the electron-blocking layer 24 and the second conductivity type semiconductor layer 22 may have four layers 28a, 28b, 28c, and 28d' having different energy band gaps Eg and different specific resistance levels. The four layers 28a, 28b, 28c, and 28d' of the hole-diffusion layer 28' may be formed of different nitride semiconductor compounds. In the exemplary embodiment, the hole-diffusion layer 28' may include a first layer 28a formed of $In_{x1}Ga_{1-x1}N(0<x1<1)$, a second layer 28b formed of GaN, a third layer 28c formed of $In_{x3}Ga_{1-x3}N(0<x3<1)$, and a fourth layer 28d' formed of $Al_{x2}Ga_{1-x2}N(0<x2<1)$, sequentially disposed on the electron-blocking layer 24.

Although the exemplary embodiment is mostly the same as the foregoing embodiment described with reference to FIG. 5C, x2 in the Al composition of the fourth layer 28d' may be reduced in a direction away from the active layer 23. In the exemplary embodiment, x2 in the Al composition of the fourth layer 28d' may be less than r in the Al composition of the electron-blocking layer 24.

FIGS. 6 through 9 are cross-sectional views illustrating various forms of semiconductor light emitting devices employable in other exemplary embodiments of the present inventive concept.

Figure 6:
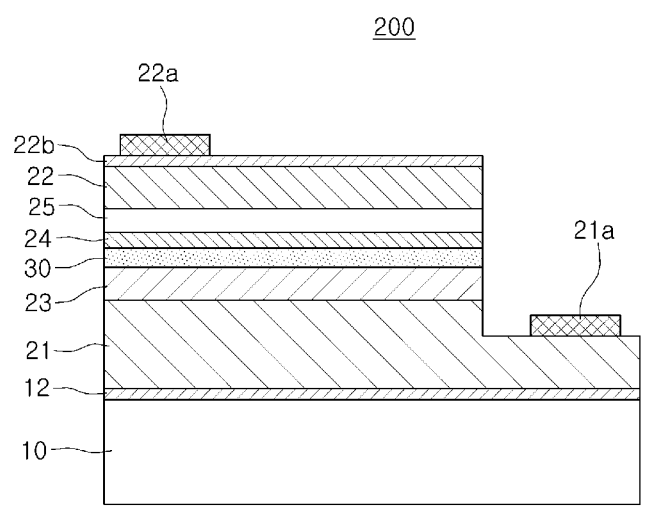
FIGS. 6 through 9 are cross-sectional views illustrating various forms of semiconductor light emitting devices employable in other exemplary embodiments of the present inventive concept.

Referring to FIG. 6, a semiconductor light emitting device 200 according to another exemplary embodiment of the present inventive concept may include a diffusion barrier layer disposed between the active layer 23 and the electron-blocking layer 24.

When p-type dopant atoms are diffused to the active layer 23, nonradiative recombination may be increased and crystallinity of the active layer 23 may be degraded. The diffusion barrier layer 30 may be disposed between the active layer 23 and the electron-blocking layer 24 to thereby prevent p-type dopant atoms contained in the second conductivity type semiconductor layer 22 and/or the electron-blocking layer 24 from being diffused to the active layer 23.

In order to perform such functions, the diffusion barrier layer 30 may contain a semiconductor material formed of $Al_cIn_dGa_{1-c-d}N(0 \leq c<1, 0 \leq d<1, 0 \leq c+d \leq 1)$. The diffusion barrier layer 30 may be formed of an undoped semiconductor. Here, the term "undoped" refers to an intentionally undoped state.

In addition, c in the Al composition may be less than x in the Al composition contained in a lower region of the electron-blocking layer 24 adjacent to the diffusion barrier layer 30. Further, c in the Al composition may be increased in a direction away from the active layer 23.

The diffusion barrier layer 30 may have an energy band gap greater than an energy band gap of the active layer 23 and the second conductivity type semiconductor layer 22, and may perform functions of effectively suppressing the overflow of electrons, together with the electron-blocking layer 24.

As the diffusion barrier layer 30 prevents the diffusion of the p-type dopant atoms, a concentration of the p-type dopant atoms may be increased in the electron-blocking layer 24 or the second conductivity type semiconductor layer 22. Accordingly, a sufficient concentration of the p-type dopant atoms may be ensured to allow for an increase in the number of electrons participating in light emission, whereby light emitting characteristics may be further improved.

Figure 7:
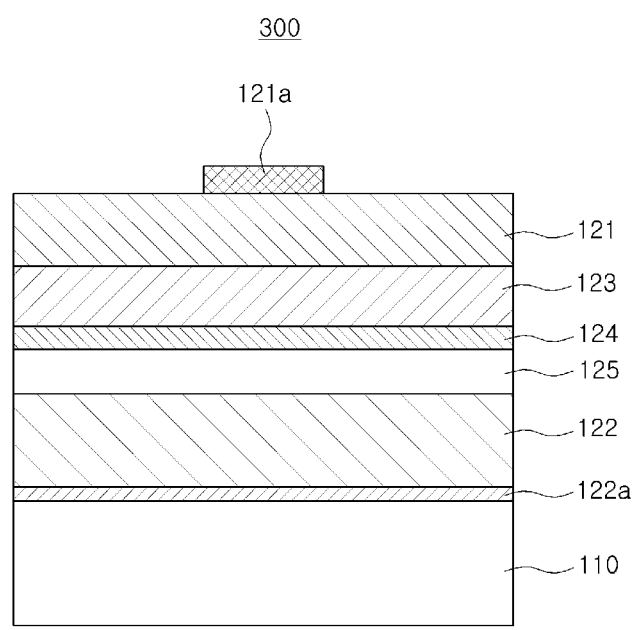

Referring to FIG. 7, a semiconductor light emitting device 300 according to another exemplary embodiment of the present inventive concept may include a light emitting structure formed on a conductive substrate 110. The light emitting structure may include a second conductivity type semiconductor layer 122, an active layer 123, and a first conductivity type semiconductor layer 121 that are sequentially stacked on the conductive substrate 110, and an electron-blocking layer 124 provided between the active layer 123 and the second conductivity type semiconductor layer 122. In the exemplary embodiment, the light emitting structure may further include a hole-diffusion layer 125 between the electron-blocking layer 124 and the second conductivity type semiconductor layer 122. The hole-diffusion layer 125 may have the material and energy band gap structure described with reference to FIGS. 1 and 2. In addition, depending on exemplary embodiments, the hole-diffusion layer 125 may have the material and energy band gap structure described with reference to FIGS. 5A through 5G. Accordingly, light emission efficiency and light output characteristics may be improved.

The first conductivity type semiconductor layer 121 may be, for example, an n-type semiconductor layer, and a first electrode 121a may be formed on an upper portion of the first conductivity type semiconductor layer 121. The second conductivity type semiconductor layer 122 may be, for example, a p-type semiconductor layer, and a reflective metal layer 122a may be disposed between the second conductivity type semiconductor layer 122 and the conductive substrate 110. The reflective metal layer 122a may be formed of a material exhibiting electrical ohmic characteristics with respect to the second conductivity type semiconductor layer 122 and further, may be formed of a highly reflective metal. In consideration of such functions, the reflective metal layer 122a may be formed to contain a material such as Ag, Ni, Al, Rh, Pd, Ir, Ru, Mg, Zn Pt, Au or the like.

The conductive substrate 110 may be connected to an external power source and serve to apply driving power to the second conductivity type semiconductor layer 122. In addition, the conductive substrate 110 may serve as a support supporting the light emitting structure in a process for removing a growth substrate used in a semiconductor growth, such as a laser lift-off (LLO) process. The conductive substrate 110 may be formed of a material containing one of Au, Ni, Al, Cu, W, Si, Se, and GaAs and for example, may be formed by doping a Si substrate with Al. In this case, the conductive substrate 110 may be formed on the reflective metal layer through a process such as a plating process, sputtering process, a deposition process or the like. Unlike this, the conductive substrate 110 that has been previously manufactured may be bonded to the reflective metal layer 122a by using a conductive bonding layer or the like.

Figure 8:
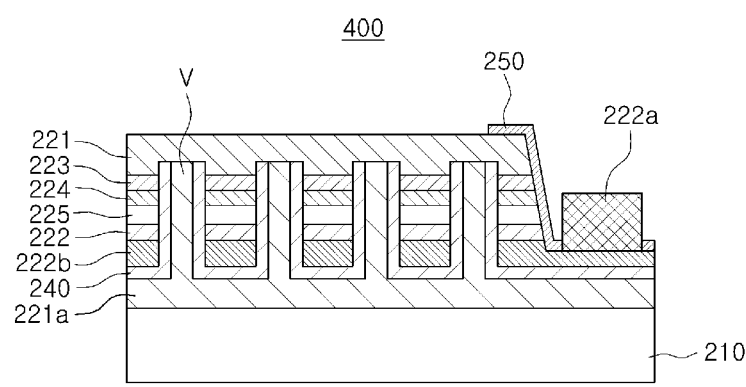

Referring to FIG. 8, a semiconductor light emitting device 400 according to another exemplary embodiment of the present inventive concept may include a first conductivity type semiconductor layer 221, an active layer 223, an electron-blocking layer 224, a hole-diffusion layer 225, a second conductivity type semiconductor layer 222, a second electrode layer 222b, a first electrode layer 221a connected to the first conductivity type semiconductor layer 221, and a substrate 210. In this case, to electrically connect the first electrode layer 221a to the first conductivity type semiconductor layer 221, the first electrode layer 221a may include one or more conductive vias V penetrating through the second electrode layer 222b, the second conductivity type semiconductor layer 222, the hole-diffusion layer 225, the electron-blocking layer 224, and the active layer 223 to be extended from one surface of the first electrode layer 221a to at least a portion of the first conductivity type semiconductor layer 221. However, since the conductive vias V may be provided for electrical connection and current dispersion of the first conductivity type semiconductor layer 221 and accordingly, the purpose of the conductive vias V may be achieved as long as the conductive vias V come into contact with the first conductivity type semiconductor layer 221, it may be unnecessary to extend the conductive vias V to an external surface of the first conductivity type semiconductor layer 221.

The hole-diffusion layer 225 may have the material and energy band gap structure described with reference to FIGS. 1 and 2. In addition, depending on exemplary embodiments, the hole-diffusion layer 225 may have the material and energy band gap structure described with reference to FIGS. 5A and 5G. Thus, light emission efficiency and light output characteristics may be improved. In addition, according to the exemplary embodiment, current dispersion characteristics may be improved and advantageous effects may be obtained in terms of heat radiation.

The first conductivity type semiconductor layer 221 may be electrically connected to the substrate 210 via the conductive vias V and the number, shape, pitch or the like, of the conductive vias V may be appropriately adjusted in order to decrease contact resistance. For example, the number, shape, pitch or the like, of the conductive vias V may be applied as in the exemplary embodiment of FIG. 8.

For electrical insulation, an insulating layer 240 may be disposed on side surfaces of the conductive vias V and the second electrode layer 222b. Since a material of the insulating layer 240 is employable, as long as it has electrical insulating properties, but it is preferable to absorb light to the smallest, the material of the insulating layer 240 may be, for example, a silicon oxide or a silicon nitride such as $SiO_2$, $SiO_xN_y$, $Si_xN_y$ or the like.

The second electrode layer 222b disposed on the second conductivity type semiconductor layer 222 may be formed of at least one material selected from among Ag, Ni, Al, Rh, Pd, Ir, Ru, Mg, Zn, Pt, Au and the like, in consideration of light reflective functions and ohmic contact characteristics with respect to the second conductivity type semiconductor layer 222. In order to increase light reflective functions, a distributed Bragg reflector (DBR) having a plurality of layers of $TiO_2/SiO_2$ or $SiO_2/Ta_2O_5$ pairs may be further included between an ohmic electrode layer and the substrate. The second electrode layer 222b may be formed using a physical deposition such as a sputtering process or a chemical deposition.

A second electrode 222a may be disposed on the second electrode layer 222b exposed by mesa etching, and the second electrode layer 222b may be electrically connected to the second electrode 222a and receive driving power from the outside.

Although not limited thereto, the substrate 210 may be formed of a material containing one of Au, Ni, Al, Cu, W, Si, Se, GaAs, SiAl, Ge, SiC, AlN, GaN, and AlGaN and may be formed through a process such as a plating process, a sputtering process, a deposition process, a bonding process or the like.

Figure 9:
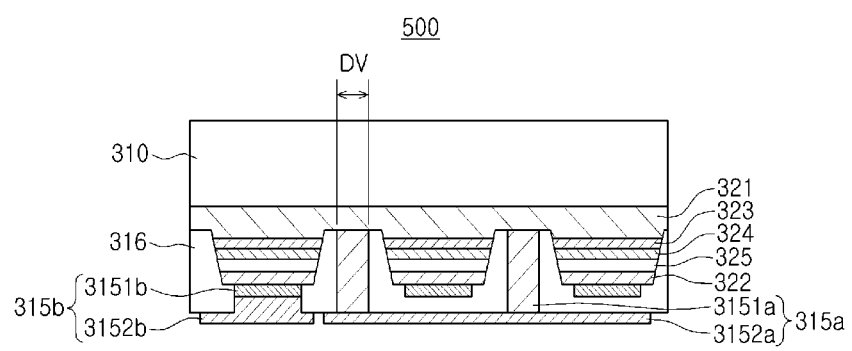

Referring to FIG. 9, a semiconductor light emitting device 500 according to another exemplary embodiment of the present inventive concept may include first and second electrode pads 315a and 315b connected to first and second conductivity type semiconductor layers 321 and 322, respectively. The first electrode pad 315a may include a conductive via 3151a penetrating through a second conductivity type semiconductor layer 322, a hole-diffusion layer 325, an electron-blocking layer 324, and an active layer 325 to be connected to the first conductivity type semiconductor layer 321, and an electrode extension part 3152a connected to the conductive via 3151a. The conductive via 3151a may be surrounded by an insulating layer 316 to be electrically separated from the active layer 323, the electron-blocking layer 324, the hole-diffusion layer 325, and the second conductivity type semiconductor layer 322. The conductive via 3151a may be disposed in an etched region of the semiconductor laminate.

The hole-diffusion layer 325 may have the material and energy band gap structure described with reference to FIGS. 1 and 2. In addition, depending on exemplary embodiments, the hole-diffusion layer 325 may have the material and energy band gap structure described with reference to FIGS. 5A through 5G. Accordingly, light emission efficiency and light output characteristics may be improved.

The number, shape, or pitch of the conductive vias 3151a or a contact area thereof with respect to the first conductivity type semiconductor layer 321 may be appropriately designed so as to reduce contact resistance. Further, the conductive vias 3151a may be arranged in a matrix form on the semiconductor laminate, whereby a current flow may be improved. The second electrode pad 315b may include an ohmic contact layer 3151b and an electrode extension part 3152b on the second conductivity type semiconductor layer 322. The number of the conductive vias 3151a or the contact area thereof may be appropriately designed such that a planar contact area between a plurality of the conductive vias 3151a arranged in rows and columns and the first conductivity type semiconductor layer 321 may range from 0.5% to 20% of the overall planar area of the light emitting laminate. A diameter DV of each conductive via 3151a in the contact area coming into contact with the first conductivity type semiconductor layer 321 may be, for example, approximately 5 μm to 50 μm. The number of the conductive vias 3151a may be 3 to 300 per region of the light emitting laminate, depending on an area of the region of the light emitting laminate. The number of the conductive vias 3151a may preferably be 4 or more per region of the light emitting laminate, but may be varied depending on an area of the region of the light emitting laminate. Distances between the respective conductive vias 3151a may have a matrix structure having rows and columns of 100 μm to 500 μm, preferably, rows and columns of 150 μm to 450 μm. In the case that the distances between the respective conductive vias 3151a are smaller than 100 μm, the number of the conductive vias 3151a may be increased while a light emitting area may be relatively reduced, thereby leading to a decrease in light emission efficiency. In the case that the distances between the respective conductive vias 3151a are greater than 500 μm, current dispersion may not be facilitated to deteriorate light emission efficiency. Depths of the conductive vias 3151a may be differently formed depending on thicknesses of the second conductivity type semiconductor layer 322, the hole-diffusion layer 325, the electron-blocking layer 324, and the active layer 323 and for example, may be range from 0.5 μm to 5.0 μm.

Figure 10:
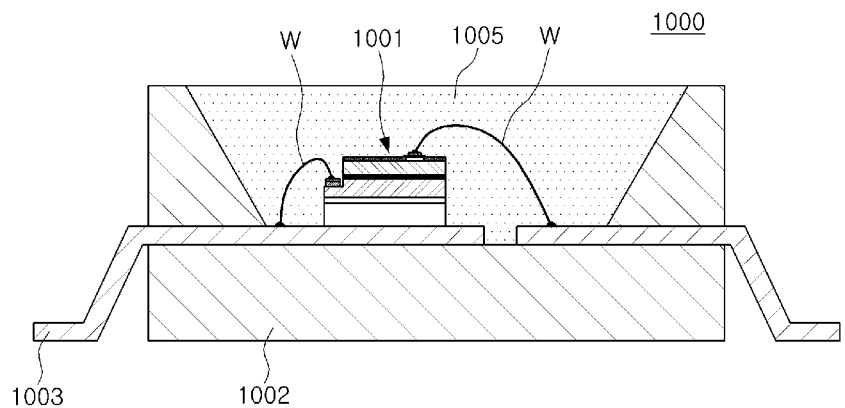
FIGS. 10 and 11 are cross-sectional views of light emitting device packages illustrating examples in which the semiconductor light emitting device according to an exemplary embodiment of the present inventive concept is applied to the packages.
Figure 11:
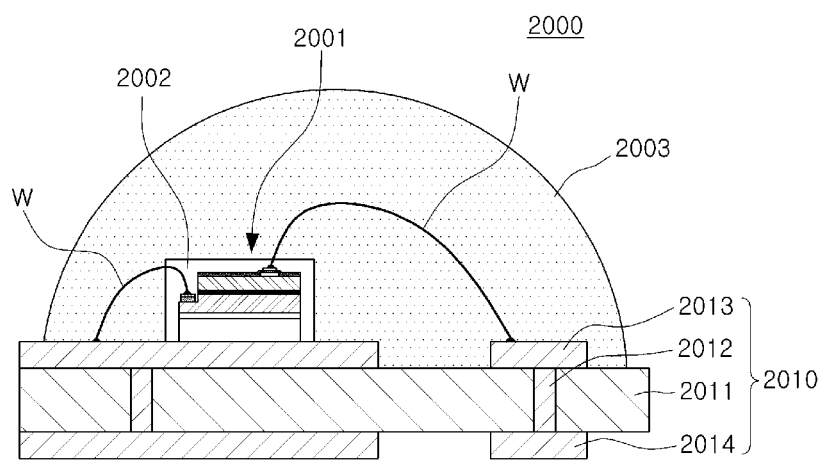

FIGS. 10 and 11 are cross-sectional views of light emitting device packages illustrating examples in which the semiconductor light emitting device according to an exemplary embodiment of the present inventive concept is applied to the packages.

Referring to FIG. 10, a semiconductor light emitting device package 1000 may include a semiconductor light emitting device 1001, a package body 1002 and a pair of lead frames 1003. The semiconductor light emitting device 1001 may be mounted on the lead frame 1003 to be electrically connected thereto through a wire W. Depending on embodiments, the semiconductor light emitting device 1001 may be mounted on another portion of the package 1000 rather than the lead frame 1003, for example, on the package body 1002. The package body 1002 may have a cup shape in order to improve light reflection efficiency, and such a reflective cup may be filled with an encapsulant 1005 containing a light transmissive material in order to encapsulate the semiconductor light emitting device 1001 and the wire W. In the embodiment, the semiconductor light emitting device package 1000 may include the semiconductor light emitting devices according to the foregoing embodiments. Depending on exemplary embodiments, the package body 1002 and/or the encapsulant 1005 may formed of a black material. If necessary, a black material may be coated on an upper surface of the package, such that the package may externally seems to be black. The black package as described above may be employed in display devices such as an electronic display and the like.

In another example, a package formed by molding a semiconductor light emitting device mounted on a circuit board such as a PCB, using a black transparent resin may be employed in display devices such as an electronic display and the like.

The black package may include a blue light emitting device and/or a green light emitting device, and a red light emitting device having the structure of the light emitting device according to the exemplary embodiment of the present inventive concept.

Referring to FIG. 11, a semiconductor light emitting device package 2000 may include a semiconductor light emitting device 2001, a mounting board 2010 and an encapsulant 2003. In addition, a wavelength conversion part 2002 may be formed on a surface and/or side surfaces of the semiconductor light emitting device 2001. The semiconductor light emitting device 2001 may be mounted on the mounting board 2010 and be electrically connected thereto through a wire W. According to exemplary embodiment, the semiconductor light emitting device 2001 may be mounted on the mounting board 2010 through flip chip bonding.

The mounting board 2010 may include a substrate body 2011, an upper surface electrode 2013, and a lower surface electrode 2014. In addition, the mounting board 2010 may also include a through electrode 2012 connecting the upper surface electrode 2013 and the lower surface electrode 2014. The mounting board 2010 may be provided as a board such as PCB, MCPCB, MPCB, FPCB or the like and a structure thereof may be used in various manners.

In a case in which the semiconductor light emitting device 2001 emits UV light or blue light, the wavelength conversion part 2002 may include at least one of blue, yellow, green and red phosphors and may combine the blue light emitted from the semiconductor light emitting device 2001 with light from the phosphor to thereby emit white light or may emit yellow, green or red light. A color temperature and a color rendering index (CRI) of white light may be adjusted by using a white light emitting module formed by combining a light emitting device package emitting white light with a package emitting yellow, green or red light. In addition, the light emitting device package may be configured to include at least one of light emitting devices emitting violet, blue, green, red and ultraviolet light. In this case, in a light emitting device package or a module product formed by combining light emitting device packages, a color rendering index (CRI) may be adjusted from 40 to 100 on a level of solar light, and various types of white light with color temperatures ranging from 2000K to 20000K may be generated. Also, if necessary, the light emitting device package or the module product formed by combining light emitting device packages may generate violet, blue, green, red or orange visible light or infrared light to adjust the color of light according to a surrounding atmosphere and a user mood. Also, the light emitting device package or the module product may generate a specific wavelength of light for accelerating the growth of plants.

Figure 12:
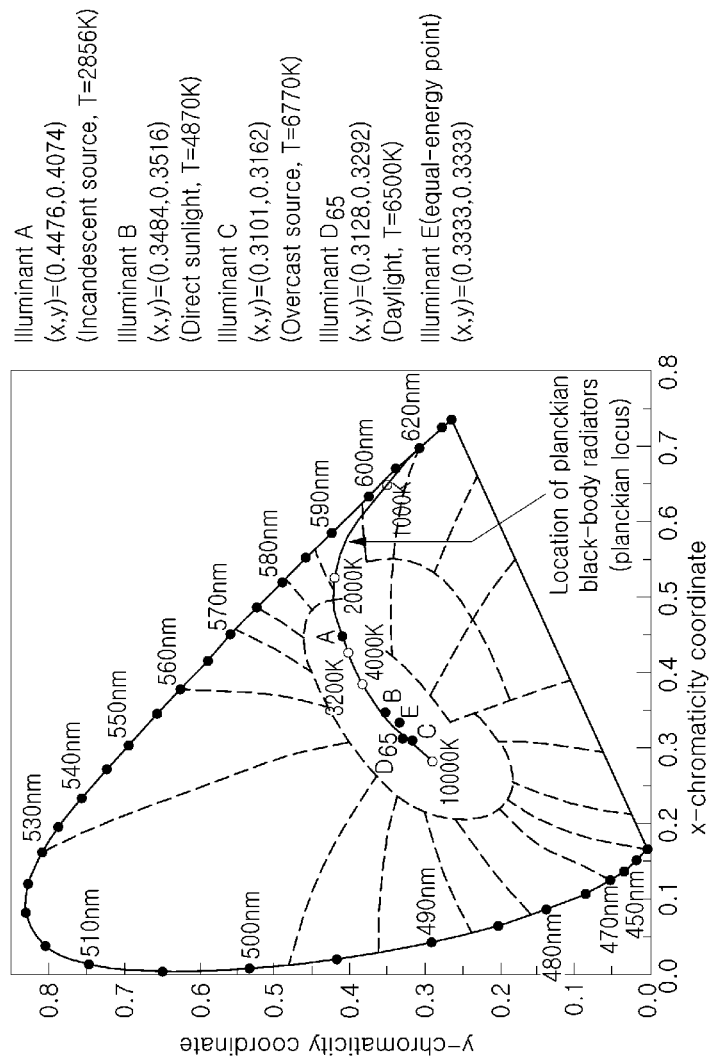
FIG. 12 is the CIE 1931 coordinate system illustrating a wavelength conversion material employable in an exemplary embodiment of the present inventive concept.

White light formed by combining yellow, green, red phosphors with a blue light emitting device and/or combining green and red light emitting devices may have two or more peak wavelengths, and coordinates (x, y) thereof in the CIE 1931 coordinate system of FIG. 12 may be positioned on a line segment connecting (0.4476, 0.4074), (0.3484, 0.3516), (0.3101, 0.3162), (0.3128, 0.3292), and (0.3333, 0.3333). Alternatively, coordinates (x, y) thereof in the CIE 1931 coordinate system may be positioned in a region surrounded by the line segment and blackbody radiation spectrum. The color temperature of white light may range from 2000K to 20000K.

The wavelength conversion part 2002 may contain phosphors or quantum dots.

The phosphors may have the following compositional formulae and colors.

Oxides: yellow and green $Y_3Al_5O_{12}$:Ce, $Tb_3Al_5O_{12}$:Ce, $Lu_3Al_5O_{12}$:Ce Silicates: yellow and green $(Ba,Sr)_2SiO_4$:Eu, yellow and orange $(Ba,Sr)_3SiO_5$:Ce, red $Ca_2SiO_4$:Eu, $Ca_{1.2}Eu_{0.8}SiO_4$ Nitrides: green $\beta$-SiAlON:Eu, yellow $La_3Si_6N_{11}$:Ce, orange $\alpha$-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$) (where, Ln is at least one element selected from a group consisting of group IIIa elements and rare-earth elements, and M is at least one element selected from a group consisting of Ca, Ba, Sr and Mg)

Fluorides: KSF based red $K_2SiF_6$:$Mn^{4+}$, $K_2TiF_6$:$Mn^{4+}$, $NaYF_4$:$Mn^{4+}$, $NaGdF_4$:$Mn^{4+}$ The phosphor composition may basically accord with stoichiometry and respective elements may be substituted with other elements within respective groups in a periodic table of the elements. For example, Sr may be substituted with Ba, Ca, Mg or the like within the alkaline earth group (II) and Y may be substituted with lanthanum (La) based elements such as Tb, Lu, Sc, Gd or the like. In addition, Eu or the like, an activator, may be substituted with Ce, Tb, Pr, Er, Yb or the like according to a desired energy level. The activator may be used alone or a co-activator or the like may be added in order to allow for modification of properties.

Further, as a material for substituting for the phosphor, a material such as a quantum dot (QD) or the like may be used, and the QD or the phosphor may be used alone or a combination of the phosphor and the QD may be used.

The quantum dot (QD) may be configured to have a core (3~10 nm) formed of CdSe, InP, or the like, a shell (0.5~2 nm) formed of ZnS, ZnSe or the like, and a ligand structure stabilizing the core and the shell, and may implement various colors depending on a size thereof.

The following Table 1 shows types of phosphors in a white light emitting device package using a UV light emitting device chip (200~440 nm) or a blue light emitting device chip (440~480 nm) according to application fields.

TABLE 1

| USAGE | Phosphor |
|---|---|
| LED TV BLU | $\beta$-SiAlON:$Eu^{2+}$, (Ca, Sr)AlSiN$_3$:$Eu^{2+}$, $La_3Si_6N_{11}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$), $K_2TiF_6$:$Mn^{4+}$, $NaYF_4$:$Mn^{4+}$, $NaGdF_4$:$Mn^{4+}$ $Ca_2SiO_4$:Eu, $Ca_{1.2}Eu_{0.8}SiO_4$ |
| Lighting Apparatuses | $Lu_3Al_5O_{12}$:$Ce^{3+}$, Ca-$\alpha$-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$), $K_2TiF_6$:$Mn^{4+}$, $NaYF_4$:$Mn^{4+}$, $NaGdF_4$:$Mn^{4+}$, $Ca_2SiO_4$:Eu, $Ca_{1.2}Eu_{0.8}SiO_4$ |
| Side View (Mobile Devices, Laptop PC) | $Lu_3Al_5O_{12}$:$Ce^{3+}$, Ca-$\alpha$-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, (Sr, Ba, Ca, Mg)$_2$SiO$_4$:$Eu^{2+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$), $K_2TiF_6$:$Mn^{4+}$, $NaYF_4$:$Mn^{4+}$, $NaGdF_4$:$Mn^{4+}$, $Ca_2SiO_4$:Eu, $Ca_{1.2}Eu_{0.8}SiO_4$ |
| Electronic Apparatuses (Headlamps, etc.) | $Lu_3Al_5O_{12}$:$Ce^{3+}$, Ca-$\alpha$-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$), $K_2TiF_6$:$Mn^{4+}$, $NaYF_4$:$Mn^{4+}$, $NaGdF_4$:$Mn^{4+}$ $Ca_2SiO_4$:Eu, $Ca_{1.2}Eu_{0.8}SiO_4$ |

The encapsulant 2003 may have a convex lens shape in which an upper surface thereof is upwardly convex, but may have a concave lens shape according to embodiments, whereby an orientation angle of light emitted through an upper surface of the encapsulant 2003 may be controlled.

In the exemplary embodiment, the semiconductor light emitting device package 2000 may include the semiconductor light emitting devices according to the foregoing embodiments.

Figure 13:
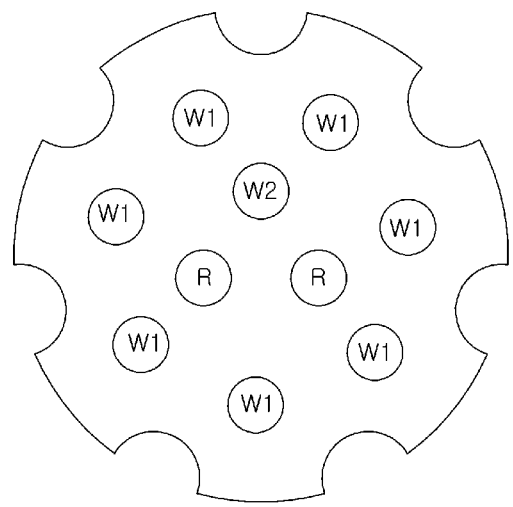
FIGS. 13 and 14 each illustrate a light source module employable in a lighting device according to an exemplary embodiment of the present inventive concept.
Figure 14:
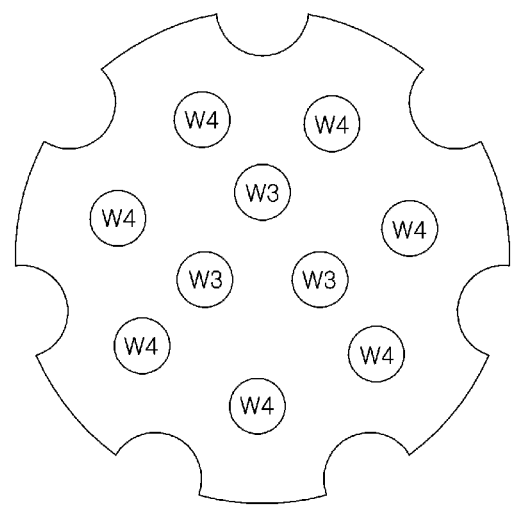

FIGS. 13 and 14 each illustrate a light source module employable in a lighting device according to an exemplary embodiment of the present inventive concept.

Referring to FIG. 13, a white light emitting device package W1 having a color temperature of 4000K, a white light emitting device package W2 having a color temperature of 3000K, and a red light emitting device package R having a color temperature of 3000K may be disposed within a white light emitting device package module. By combining the light emitting device packages, a white light emitting device package module in which a color temperature thereof may be adjusted within a range of 2000K to 4000K and a color rendering index Ra thereof is 85 to 99 may be manufactured. The module may be employed in a bulb-type lamp of FIG. 17 and the like.

Referring to FIG. 14, a white light emitting device package W3 having a color temperature of 5000K and a white light emitting device package W4 having a color temperature of 2700K may be disposed within a white light emitting device package module. By combining the light emitting device packages, a white light emitting device package module in which a color temperature thereof may be adjusted within a range of 2700K to 5000K and a color rendering index Ra thereof is 85 to 99 may be manufactured. The module may be employed in a bulb-type lamp of FIG. 17 and the like.

The number of light emitting device packages may be varied depending on a basic, predetermined value of a color temperature. In the case that the basic, predetermined value of the color temperature is in the vicinity of 4000K, the number of light emitting device packages corresponding to the color temperature of 4000K may be greater than that of light emitting device packages having a color temperature of 3000K or red light emitting device packages.

Figure 15:
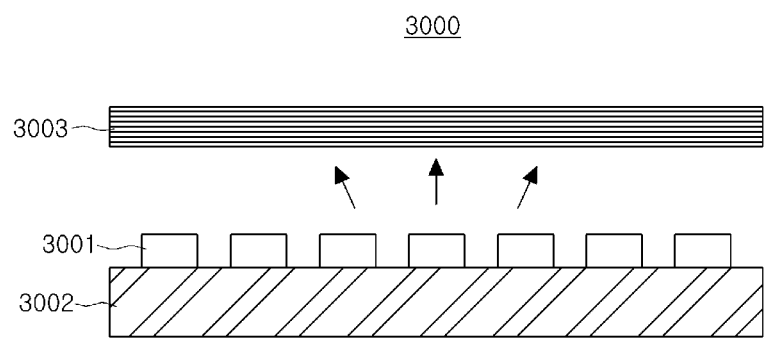
FIGS. 15 and 16 are cross-sectional views each illustrating an example in which the semiconductor light emitting device according to an exemplary embodiment of the present inventive concept is applied to a backlight unit.
Figure 16:
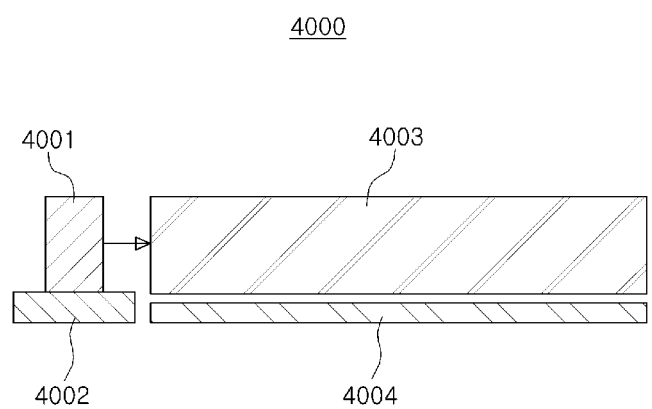

FIGS. 15 and 16 are cross-sectional views each illustrating an example in which the semiconductor light emitting device according to an exemplary embodiment of the present inventive concept is applied to a backlight unit.

Referring to FIG. 15, a backlight unit 3000 may include a light source 3001 mounted on a substrate 3002 and at least one optical sheet 3003 disposed thereabove. The light source 3001 may be provided in the form of a chip-on-board (COB) type structure in which at least one semiconductor light emitting device according to the foregoing embodiments may be directly mounted on the substrate 3002. Alternatively, the semiconductor light emitting device package 2000 may be used.

The light source 3001 in the backlight unit 3000 of FIG. 15 emits light toward a liquid crystal display (LCD) device disposed thereabove. On the other hand, a light source 4001 mounted on a substrate 4002 in a backlight unit 4000 according to another embodiment illustrated in FIG. 16 emits light laterally and the emitted light is incident to a light guide plate 4003 and may be converted into the form of a surface light source. The light having passed through the light guide plate 4003 may be emitted upwardly and a reflective layer 4004 may be formed under a bottom surface of the light guide plate 4003 in order to improve light extraction efficiency.

Figure 17:
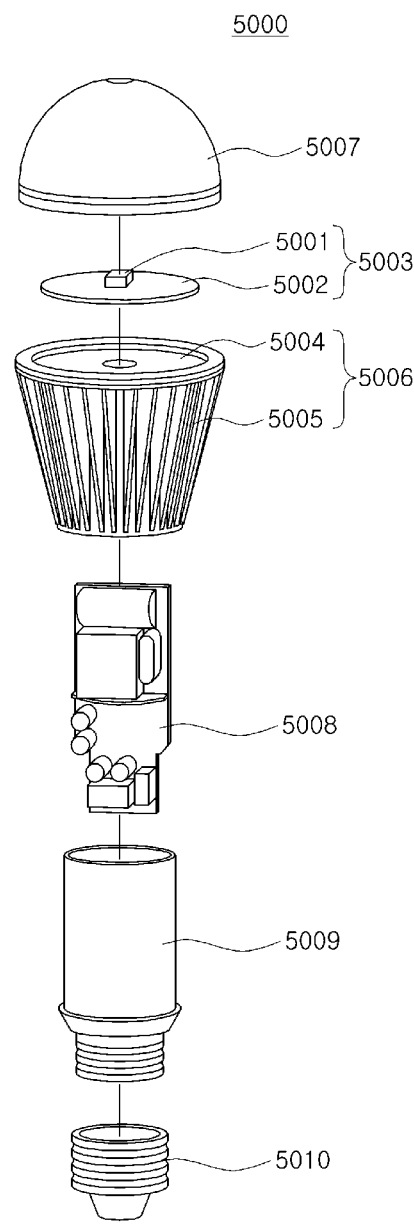
FIGS. 17 through 19 are exploded perspective views of lighting devices, each illustrating an example in which the semiconductor light emitting device according to an exemplary embodiment of the present inventive concept is applied to the lighting device.
Figure 18:
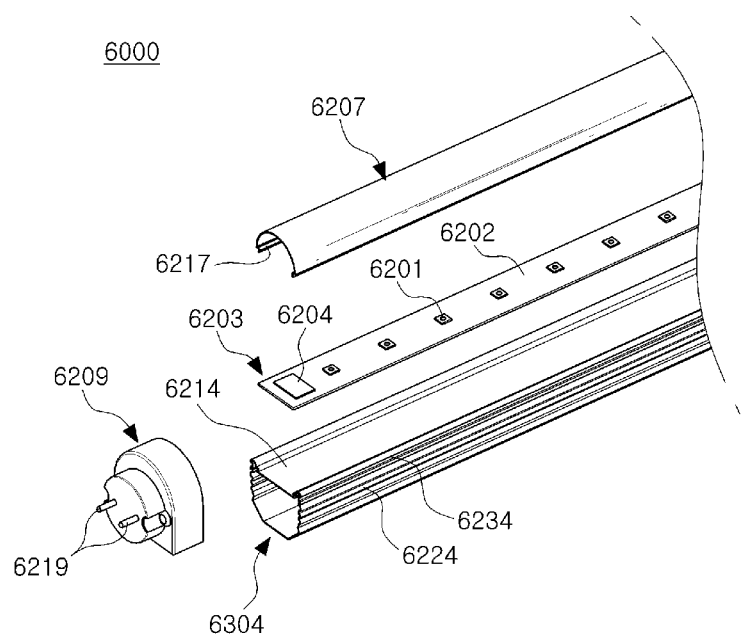

FIGS. 17 and 18 each illustrate an example in which the semiconductor light emitting device according to an exemplary embodiment of the present inventive concept is applied to the lighting device.

Referring to an exploded perspective view of FIG. 17, a lighting device 5000 is exemplified as a bulb-type lamp, and includes a light emitting module 5003, a driving unit 5008 and an external connector unit 5010. In addition, exterior structures such as an external housing 5006, an internal housing 5009, a cover unit 5007 and the like may be additionally included. The light emitting module 5003 may include a light source 5001 and a circuit board 5002 having the light source 5001 mounted thereon. The light source 5001 may be the semiconductor light emitting device, the light emitting device package or the like described in the foregoing embodiment.

The embodiment illustrates the case in which a single light source 5001 is mounted on the circuit board 5002; however, if necessary, a plurality of light sources may be mounted thereon.

In addition, in the lighting device 5000, the light emitting module 5003 may include the external housing 5006 serving as a heat radiating part and including a heat sink plate 5004 in direct contact with the light emitting module 5003 to improve the dissipation of heat. In addition, the lighting device 5000 may include the cover unit 5007 mounted above the light emitting module 5003 and having a convex lens shape. The driving unit 5008 may be disposed inside the internal housing 5009 and may be connected to the external connector unit 5010 such as a socket structure to receive power from an external power source. In addition, the driving unit 5008 may convert the received power into a current source appropriate for driving the light source 5001 of the light emitting module 5003 and supply the converted current source thereto. For example, the driving unit 5008 may be configured of an AC-DC converter, a rectifying circuit part, or the like.

Meanwhile, the lighting device in which a light source device is implemented according to an exemplary embodiment of the present inventive concept may be a bar-type lamp as illustrated in FIG. 18 and may have a shape similar to a fluorescent lamp so as to be substituted with the fluorescent lamp according to the related art, but is not limited to having such a shape. The lighting device 5000 may emit light having light characteristics similar to those of the fluorescent lamp.

Referring to the exploded perspective view of FIG. 18, a lighting device 6000 according to the exemplary embodiment may include a light source part 6203, a body part 6204, and a driving part 6209 and may further include a cover part 6207 covering the light source part 6203.

The light source part 6203 may include a substrate 6202 and a plurality of light sources 6201 mounted on the substrate 6202. A light source 6201 may be the semiconductor light emitting device, or the semiconductor light emitting device package described in the foregoing embodiments.

The body part 6204 may have the light source part 6203 mounted on one surface thereof to be fixed thereto. The body part 6204 may be a sort of support structure and include a heat sink. The body part 6204 may be formed of a material having high thermal conductivity so as to emit heat generated from the light source part 6203 outwardly. For example, the body part 6204 may be formed of a metal material, but is not limited thereto.

The body part 6204 may have an elongated bar shape corresponding to a shape of the substrate 6202 of the light source part 6203. The body part 6204 may have a recess 6214 formed in a surface thereof on which the light source part 6203 is mounted, the recess 6214 being capable of receiving the light source part 6203 therein.

A plurality of heat radiating fins 6224 for the radiation of heat may be formed on at least one outer side surface of the body part 6204 so as to protrude therefrom. In addition, a catching groove 6234 may be formed in at least one distal end of the outer side surface disposed above the recess 6214, the catching groove 6234 being extended in a length direction of the body part 6204. The cover part 6207, to be described later, may be coupled to the catching groove 6234.

At least one of both ends of the body part 6204 in the length direction may be opened and thus, the body part 6204 has a pipe shape having at least one open end.

The driving part 6209 may be provided in at least one open end of the both ends of the body part 6204 in the length direction and supply driving power to light source part 6203. The exemplary embodiment illustrates that at least one end of the body part 6204 is opened and has the driving part 6209 provided therein. However, the present inventive concept is not limited thereto and for example, the driving part 6209 may be coupled to the at least one open end of the body part 6204 and cover the open both ends of the body part 6204. The driving part 6209 may include outwardly protruded electrode pins 6219.

The cover part 6207 may be coupled to the body part 6204 and cover the light source part 6203. The cover part 6207 may be formed of a light transmissive material.

The cover part 6207 may have a curved semicircular surface to enable light to be generally externally irradiated in a uniform manner. In addition, a bottom surface of the cover part 6207 coupled to the body part 6204 thereof may be provided with protrusions 6217 formed in the length direction of the cover part 6207 and engaged with the catching grooves 6234 of the body part 6204.

The exemplary embodiment illustrates that the cover part 6207 has a semicircular shape, but the cover part 6207 is not limited thereto. For example, the cover part 6207 may have a flat quadrangular shape and may also have other polygonal shapes. Such a shape of the cover part 6207 may be variously changed depending on a design of a lighting device from which light is irradiated.

Figure 19:
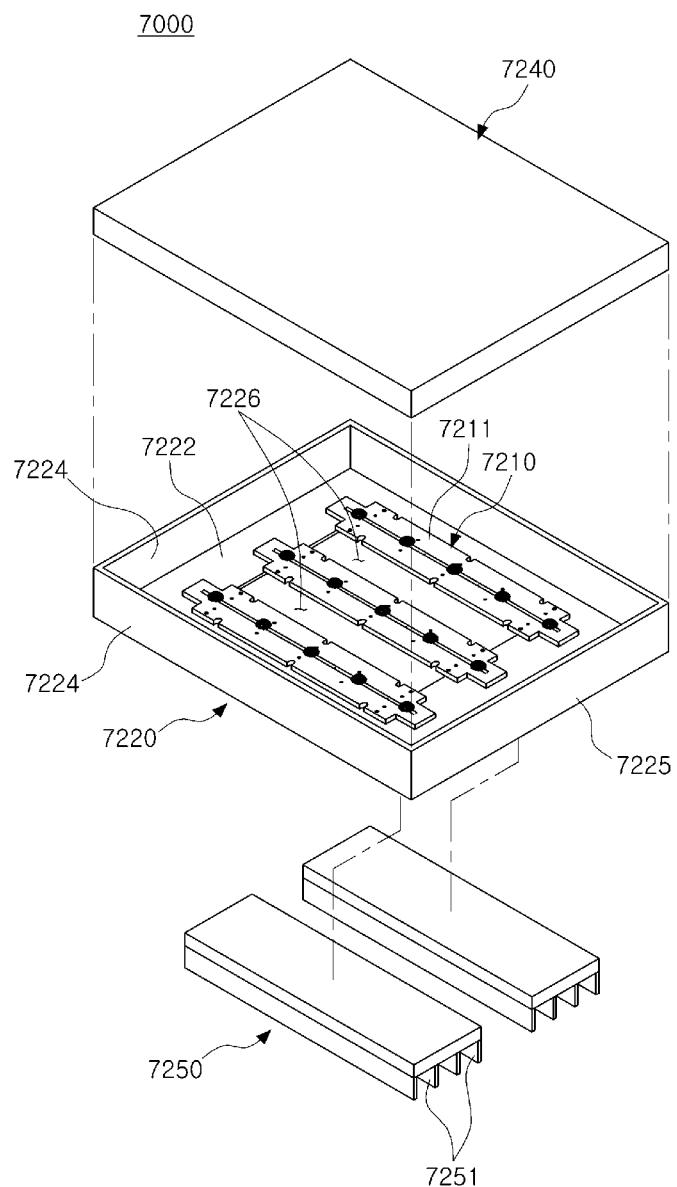

FIG. 19 is an exploded perspective view schematically illustrating a lighting device according to another exemplary embodiment of the present inventive concept.

Referring to FIG. 19, a lighting device 7000 may have a surface light source structure and may be configured to include a light source module 7210, a housing 7220, a cover 7240 and a heat sink 7250.

The light source module 7210 may be the semiconductor light emitting device or the light emitting device package described in the foregoing exemplary embodiment, or the like. Thus, a detailed description thereof will be omitted. A plurality of light source modules 7210 may be arranged and mounted on a circuit board 7211.

The housing 7220 may have a box shape by including one surface 7222 on which the light source module 7210 is mounted and side surfaces 7224 extended from edges of one surface 7222. The housing 7220 may be formed of a material having excellent thermal conductivity, for example, a metal, so as to emit heat generated from the light source modules 7210, outwardly.

Holes 7226 may be formed in one surface 7222 of the housing 7220 to penetrate therethrough. The heat sinks 7250 to be described later may be inserted into and coupled to the holes 7226. In addition, the circuit board 7211 on which the light source modules 7210 are mounted (the circuit board 7211 to be mounted on one surface 7222) may be partially disposed over the holes 7226 to be exposed outwardly.

The cover 7240 may be coupled to the housing 7220 so as to cover the light source modules 7210 and have a generally flat structure.

The heat sinks 7250 may be fastened into the holes 7226 through the other surface 7225 of the housing 7220. In addition, the heat sinks 7250 may come into contact with the light source modules 7210 through the holes 7226 to discharge heat from the light source modules 7210 outwardly. In order to improve heat radiation efficiency, the heat sinks 7250 may include a plurality of heat radiation fins 7251. The heat sinks 7250 may be formed of a material having excellent thermal conductivity, similarly to the housing 7220.

The lighting device using the light emitting device may be classified as an indoor lighting device and an outdoor lighting device. Indoor LED lighting devices may be generally provided to replace or retrofit existing lighting devices, and may include bulb type lamps, fluorescent lamps (LED-tubes), and flat type illumination devices. Outdoor LED lighting devices may include street lamps, security lamps, floodlighting lamps, scenery lamps, traffic lights, and the like.

The lighting device using LEDs may be employed as internal or external light sources of vehicles. Internal light sources of vehicles may include indoor lights, reading lights, gauge light sources, and the like. External light sources of vehicles may include various light sources such as headlights, break lights, turn indicators, fog lights, running lights and the like.

In addition, as light sources used for robots or various mechanical devices, LED lighting devices may be used. In particular, LED lighting devices using specific waveform bands may promote the growth of plants and may stabilize emotions or treat illnesses in humans.

Figure 20:
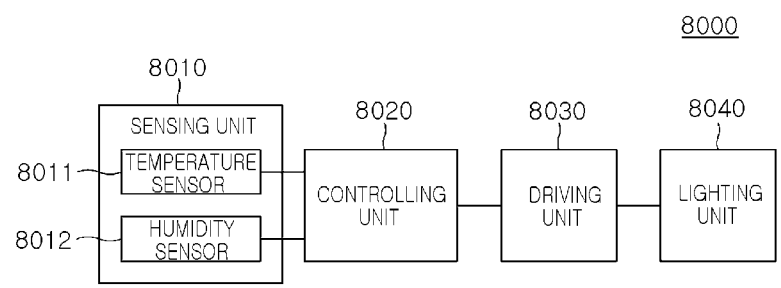
FIG. 20 is a block diagram schematically illustrating a lighting system according to an exemplary embodiment of the present inventive concept.
Figure 21:
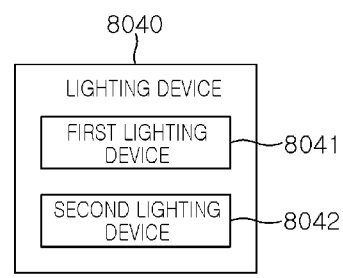
FIG. 21 is a block diagram schematically illustrating a detailed configuration of a lighting unit in the lighting system shown in FIG. 20.

With reference to FIGS. 20 and 21, a lighting system using the lighting device will be described. A lighting system 8000 according to an exemplary embodiment of the present inventive concept may automatically control a color temperature according to surrounding environments (for example, temperature and humidity), and may provide a lighting apparatus serving as a mood lighting capable of satisfying human sensibility, not merely serving as a simple lighting fixture.

FIG. 20 is a block diagram schematically illustrating a lighting system according to an exemplary embodiment of the present inventive concept.

Referring to FIG. 20, the lighting system 8000 according to the exemplary embodiment of the present inventive concept may include a sensing unit 8010, a controlling unit 8020, a driving unit 8030, and a lighting unit 8040.

The sensing unit 8010 may be installed in indoor and outdoor environments and may include a temperature sensor 8011 and a humidity sensor 2012 to measure at least one atmospheric condition among ambient temperature and humidity. In addition, the sensing unit 8010 may transfer the measured atmospheric condition, that is, temperature and humidity information, to the controlling unit 8020 electrically connected to the sensing unit 8010.

The controlling unit 8020 may compare the measured atmospheric temperature and humidity with an atmospheric condition (temperature and humidity range) preset by a user and as a comparison result, may determine a color temperature of the lighting unit 8040 corresponding to the atmospheric condition. The controlling unit 8020 may be electrically connected to the driving unit 8030 and control the driving unit 8030 to drive the lighting unit 8040 at the determined color temperature.

FIG. 21 illustrates components of the lighting unit 8040 illustrated in FIG. 20.

Referring to FIG. 21, the lighting unit 8040 may be operated by power supplied from the driving unit 8030. The lighting unit 8040 may include at least one of the lighting devices illustrated in FIGS. 17 through 19. For example, the lighting unit 8040 may be configured of first and second lighting devices 8041 and 8042 having different color temperatures from each other and each of the first and second lighting devices 8041 and 8042 may include a plurality of light emitting devices emitting the same white light.

The first lighting device 8041 may emit white light having a first color temperature and the second lighting device 8042 may emit white light having a second color temperature. The first color temperature may be lower than the second color temperature or vice versa, that is, the first color temperature may be higher than the second color temperature. Here, white light having a relatively low color temperature may correspond to warm white light, while white light having a relatively high color temperature may correspond to cold white light. When power is supplied to the first and second lighting devices 8041 and 8042, the first and second lighting devices 8041 and 8042 may emit white light having the first color temperature and white light having the second color temperature, respectively. The white light having the first color temperature and the white light having the second color temperature may be combined with each other to thereby implement white light having the color temperature determined by the controlling unit.

Specifically, when the first color temperature is lower than the second color temperature, in the case that a relatively high color temperature is determined by the controlling unit, a quantity of light of the first lighting device 8041 may be reduced while a quantity of light of the second lighting device 8042 may be increased, such that combined white light may be implemented as having the determined color temperature. In this case, quantities of the respective lighting devices 8041 and 8042 may be implemented by controlling the quantity of light of all the light emitting devices through the adjustment of power, or may be implemented by adjusting the number of driven light emitting devices.

Figure 22:
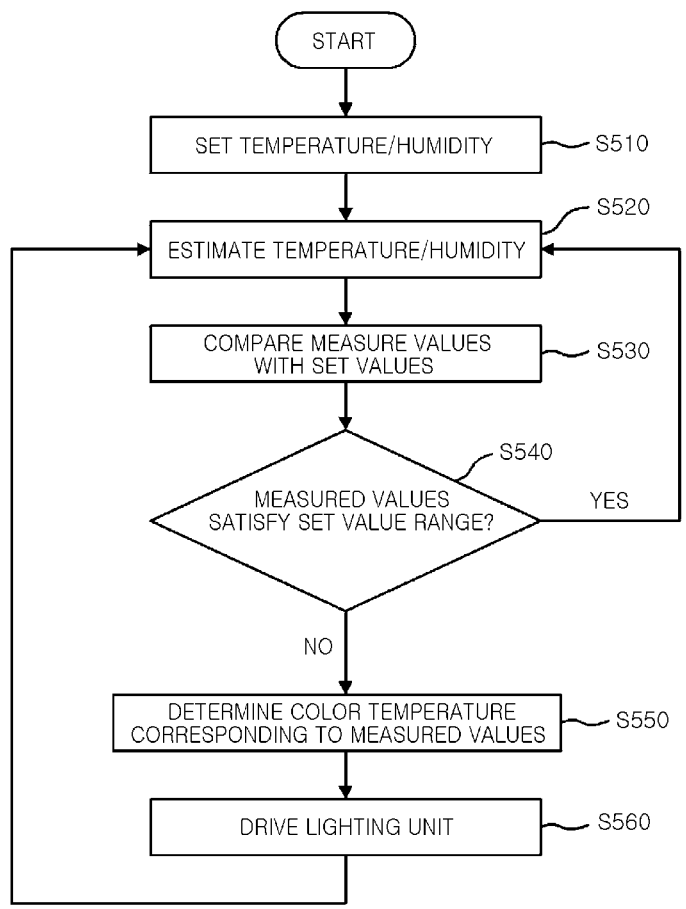
FIG. 22 is a flowchart illustrating a method of controlling the lighting system shown in FIG. 20.

FIG. 22 is a flowchart illustrating a method of controlling the lighting system shown in FIG. 20. Referring to FIG. 22, first, a user may set a color temperature through the controlling unit according to the temperature and humidity range (S510). The set temperature and humidity data may be stored in the controlling unit.

In general, in the case of a color temperature equal to or higher than 6000K, a relatively cold color such as blue may be exhibited, while in the case of a color temperature of equal to or less than 4000K, a relatively warm color such as red may be exhibited. Thus, in the exemplary embodiment, in the case that temperature and humidity exceed 20° C. and 60%, respectively, a user may set the lighting unit to be illuminated at a color temperature of 6000K or more, using the controlling unit. In the case that temperature and humidity are 10° C. to 20° C. and 40% to 60%, respectively, a user may set the lighting unit to be illuminated at a color temperature of 4000K to 6000K, using the controlling unit. In the case that temperature and humidity are 10° C. or less and 40% or less, respectively, a user may set the lighting unit to be illuminated at a color temperature of 4000K or less, using the controlling unit.

Then, the sensing unit may measure at least one of atmospheric temperature and humidity conditions (S520). Information regarding the temperature and humidity measured by the sensing unit may be transferred to the controlling unit.

Then, the controlling unit may compare measured values transferred from the sensing unit with set values (S530). Here, the measured values are data of the temperature and humidity measured by the sensing unit, and the set values are data of the temperature and humidity previously set by the user and stored in the controlling unit. That is, the controlling unit may compare the measured temperature and humidity with the previously set temperature and humidity.

As comparison result, whether or not the measured values satisfy a set value range may be determined (S540). When the measured values satisfy the set value range, a current color temperature may be maintained and temperature and humidity may be re-measured (S520). Meanwhile, when the measured values do not satisfy the set value range, set values corresponding to the measured values may be detected, and a color temperature corresponding thereto may be determined (S550). In addition, the controlling unit may control the driving unit to drive the lighting unit at the determined color temperature.

Then, the driving unit may drive the lighting unit to have the determined color temperature (S560). That is, the driving unit may supply the lighting unit with power required for driving the lighting unit to the determined color temperature. Accordingly, the lighting unit may be controlled to have a color temperature corresponding to the temperature and humidity previously set by the user according to atmospheric temperature and humidity conditions.

Therefore, the lighting system may automatically control a color temperature of an indoor lighting unit according to atmospheric temperature and humidity variations, whereby human sensibility varied according to environment changes may be satisfied and also, psychological stability may be provided to human beings.

Figure 23:
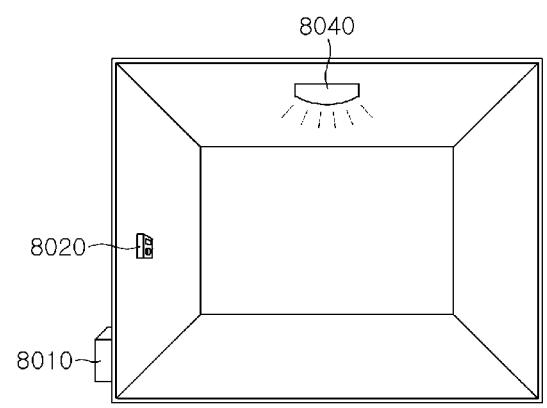
FIG. 23 is an exemplary view schematically illustrating the use of the lighting system shown in FIG. 20.

FIG. 23 is an exemplary view schematically illustrating the use of the lighting system shown in FIG. 20. As illustrated in FIG. 23, the lighting unit 8040, an indoor lighting fixture, may be installed on the ceiling. In this case, the sensing unit 8010 may be realized as a separate device in order to measure outdoor temperature and humidity and may be installed on the outside wall. In addition, the controlling unit 8020 may be installed in an indoor space so as to facilitate the user's setting and confirmation. However, the lighting system according to the exemplary embodiment is not limited thereto, and the lighting system may be installed on an inner wall instead of interior lightings or may be applied to lighting elements and the like such as standing lamps, usable in indoor and outdoor environments.

Optical designs of LED lighting devices may be changed depending on product forms, intended locations, and objects thereof. With regard to mood lighting devices, controlling of such lighting devices may be performed using technologies of controlling a color, a temperature, and brightness of the lighting device, as well as a wireless (remote) control technology employing cellular phones such as smartphones.

In addition thereto, communication functions may be added to the LED lighting devices and display devices to thereby allow for the visible light wireless communication technology intended to simultaneously achieve essential purposes of an LED light source and purposes thereof as a communications means. This because LED light sources may be advantageous, in that they have a relatively long lifespan as compared to existing light sources and excellent power efficiency, allow for the implementation of various colors of light, have a high switching speed for digital communications, and enable digital controlling.

The visible light wireless communications technology may be a wireless communications technology wirelessly transmitting information using light within the visible light wavelength band. The visible light wireless communications technology may be differentiated from existing wired optical communications and infrared wireless communications technologies in that it uses light within visible light wavelength bands, and may be differentiated from wired optical communications technology in terms of wireless communications environments thereof.

In addition, the visible light wireless communications technology may have convenience in that it is able to be freely used without regulations or permission in terms of the frequency of use thereof, unlike in radio frequency (RF) wireless communications, and may have discrimination in that physical security is excellent and communication links are able to be determined by a user's eyes. Furthermore, the visible light wireless communications technology may have characteristics as a fused technology capable of simultaneously achieving essential purposes of a light source and communications functions thereof.

Figure 24:
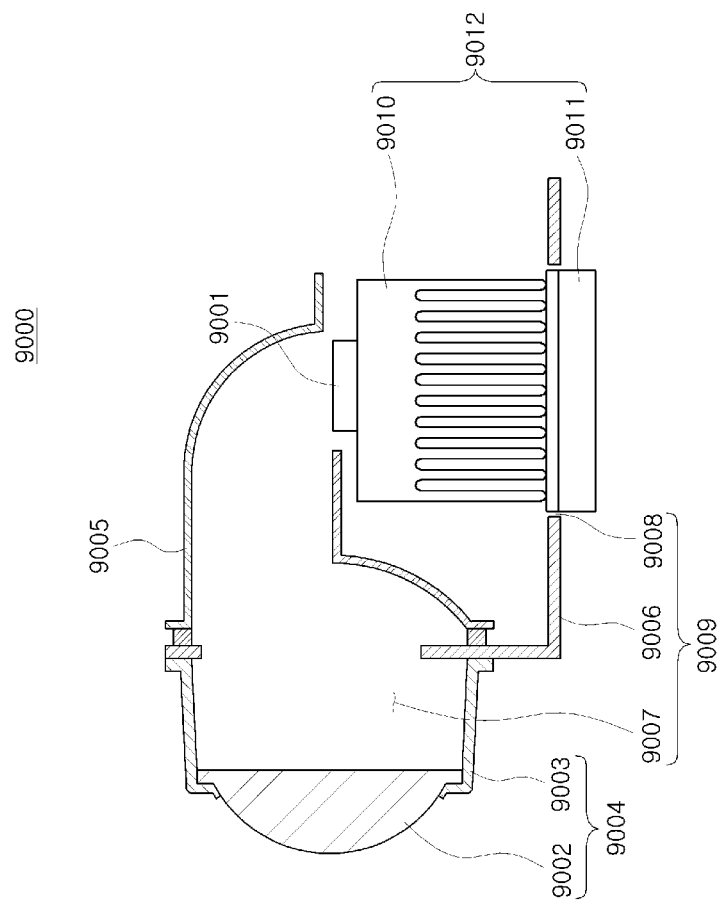
FIG. 24 is a cross-sectional view of a head lamp, illustrating an example in which the semiconductor light emitting device according to an exemplary embodiment of the present inventive concept is applied to the head lamp.

FIG. 24 is a cross-sectional view of a head lamp, illustrating an example in which the semiconductor light emitting device according to an exemplary embodiment of the present inventive concept is applied to the head lamp.

Referring to FIG. 24, a headlamp 9000 used as a vehicle lighting element or the like may include a light source 9001, a reflective unit 9005 and a lens cover unit 9004, the lens cover unit 9004 including a hollow guide part 9003 and a lens 9002. The light source 9001 may be the semiconductor light emitting device or the light emitting device package described according to the foregoing exemplary embodiments.

The headlamp 9000 may further include a heat radiating unit 9012 dissipating heat generated by the light source 9001 outwardly. The heat radiating unit 9012 may include a heat sink 7010 and a cooling fan 9011 in order to effectively dissipate heat.

In addition, the headlamp 9000 may further include a housing 9009 allowing the heat radiating unit 9012 and the reflective unit 9005 to be fixed thereto and supported thereby. One surface of the housing 9009 may be provided with a central hole 9008 into which the heat radiating unit 9012 is inserted to be coupled thereto.

The other surface of the housing 9009 integrally connected to and bent in a direction perpendicular to the one surface of the housing 9009 may be provided with a forward hole 9007 such that the reflective unit 9005 may be disposed above the light source 9001. Accordingly, a forward side may be opened by the reflective unit 9005 and the reflective unit 9005 may be fixed to the housing 9009 such that the opened forward side corresponds to the forward hole 9007, whereby light reflected by the reflective unit 9005 disposed above the light source 9001 may pass through the forward hole 9007 to thereby be emitted outwardly.

As set forth above, according to exemplary embodiments of the present inventive concept, a hole-diffusion layer capable of dispersing holes in a transverse direction may be disposed on an electron-blocking layer, such that injection efficiency of the electrons may be improved and light emission efficiency and light outputs may be improved.

While exemplary embodiments have been shown and described above, it will be apparent to those skilled in the art that modifications and variations could be made without departing from the spirit and scope of the present inventive concept as defined by the appended claims.

What is claimed is:

1. A semiconductor light emitting device comprising:
a first conductivity type semiconductor layer;
an active layer disposed on the first conductivity type semiconductor layer;
an electron-blocking layer disposed on the active layer;
a second conductivity type semiconductor layer disposed on the electron-blocking layer; and
a hole-diffusion layer disposed between the electron-blocking layer and the second conductivity type semiconductor layer,
wherein the hole-diffusion layer includes three layers having different energy band gaps and different resistance levels and at least one of the three layers contains Al, a composition of the Al being lower in the at least one layer than in the electron-blocking layer.

2. The semiconductor light emitting device of claim 1, wherein the three layers of the hole-diffusion layer include a first layer formed of $In_{x1}Ga_{1-x1}N(0<x1<1)$, a second layer formed of GaN, and a third layer formed of $Al_{x2}Ga_{1-x2}N$ $(0<x2<1)$, sequentially disposed on the electron-blocking layer.

3. The semiconductor light emitting device of claim 2, wherein the hole-diffusion layer further includes an additional layer of $In_{x3}Ga_{1-x3}N(0<x3<1)$ interposed between the second and third layers.

4. The semiconductor light emitting device of claim 1, wherein the composition of the Al is reduced in a direction away from the electron-blocking layer.

5. The semiconductor light emitting device of claim 1, wherein the three layers of the hole-diffusion layer include a first layer formed of GaN, a second layer formed of $In_{x1}Ga_{1-x1}N(0<x1<1)$, and a third layer formed of $Al_{x2}Ga_{1-x2}N$ $(0<x2<1)$, sequentially disposed on the electron-blocking layer.

6. The semiconductor light emitting device of claim 5, wherein the composition of the Al in the third layer is reduced in a direction away from the electron-blocking layer.

7. The semiconductor light emitting device of claim 1, wherein the three layers of the hole-diffusion layer include a first layer formed of GaN, a second layer formed of $Al_{x2}Ga_{1-x2}N(0<x2<1)$, and a third layer formed of $In_{x1}Ga_{1-x1}N$ $(0<x1<1)$, sequentially disposed on the electron-blocking layer.

8. The semiconductor light emitting device of claim 7, wherein the composition of the Al in the second layer is reduced in a direction away from the electron-blocking layer.

9. The semiconductor light emitting device of claim 1, wherein at least one of the three layers does not contain an intentionally doped dopant.

10. The semiconductor light emitting device of claim 1, wherein thicknesses of the respective layers forming the hole-diffusion layer are within a range of 5 nm to 30 nm.

11. The semiconductor light emitting device of claim 1, wherein the active layer has a structure in which quantum well layers formed of $In_{y1}Ga_{1-y1}N(0<y1<1)$ and quantum barrier layers formed of $Al_{x2}In_{y2}Ga_{1-x2-y2}N(0\leq x2<1, 0\leq y2<y1, 0\leq x2+y2<1)$ are alternately stacked.

12. The semiconductor light emitting device of claim 1, wherein the electron-blocking layer is formed of $Al_rGa_{1-r}N$ $(0<r\leq1)$ and has the composition of the Al reduced in a direction away from the active layer.

13. The semiconductor light emitting device of claim 1, further comprising: conductive vias penetrating through the second conductivity type semiconductor layer, the hole-diffusion layer, the electron-blocking layer, and the active layer, wherein the conductive vias have a diameter of 5 μm to 50 μm and a distance between the conductive vias adjacent to each other ranges from 100 μm to 500 μm.

14. The semiconductor light emitting device of claim 1, further comprising: a second electrode layer disposed on the second conductivity type semiconductor layer,
wherein the second electrode layer contains at least one of Ag, Ni, Al, Rh, Pd, Ir, Ru, Mg, Zn, Pt, Au and the like, and a distributed Bragg reflector (DBR) having a plurality of layers of $TiO_2/SiO_2$ or $SiO_2/Ta_2O_5$ pairs is further included between the second electrode layer and a substrate.

15. The semiconductor light emitting device of claim 1, wherein among the three layers of the hole-diffusion layer, a layer having the largest energy band gap has the largest thickness and a layer having the smallest energy band gap has the smallest thickness.

16. A semiconductor light emitting device comprising:
an n-type semiconductor layer and a p-type semiconductor layer;
an active layer disposed between the n-type semiconductor layer and the p-type semiconductor layer;
an electron-blocking layer disposed between the active layer and the p-type semiconductor layer;
a diffusion barrier layer disposed between the active layer and the electron-blocking layer; and
a hole-diffusion layer disposed between the electron-blocking layer and the p-type semiconductor layer,
wherein the hole-diffusion layer includes three layers having different compositions and different dopant-doping concentrations and at least one of the three layers contains Al, a composition of the Al being lower in the at least one layer than in the electron-blocking layer.

17. The semiconductor light emitting device of claim 16, wherein the diffusion barrier layer contains a semiconductor material formed of $Al_cIn_dGa_{1-c-d}N (0 \leq c < 1, 0 \leq d < 1, 0 \leq c+d \leq 1)$, and the diffusion barrier layer has an energy band gap greater than an energy band gap of the active layer and an energy band gap of the p-type semiconductor layer.

18. A semiconductor light emitting device comprising:
a first conductivity type semiconductor layer;
an active layer disposed on the first conductivity type semiconductor layer;
an electron-blocking layer disposed on the active layer;
a second conductivity type semiconductor layer disposed on the electron-blocking layer; and
a hole-diffusion layer disposed between the electron-blocking layer and the second conductivity type semiconductor layer,
wherein the hole-diffusion layer includes three layers having different energy band gaps and at least one of the three layers contains Al, a composition of the Al in any layer of the hole-diffusion layer being lower than in the electron-blocking layer.

19. The semiconductor light emitting device of claim 18, wherein among the three layers of the hole-diffusion layer, a layer having the largest energy band gap has the largest thickness and a layer having the smallest energy band gap has the smallest thickness.

20. The semiconductor light emitting device of claim 18, further comprising a diffusion barrier layer, containing a semiconductor material formed of $Al_cIn_dGa_{1-c-d}N (0 \leq c < 1, 0 \leq d < 1, 0 \leq c+d \leq 1)$, disposed between the active layer and the electron-blocking layer.

* * * * *